United States Patent
Han et al.

(10) Patent No.: US 12,385,803 B2
(45) Date of Patent: Aug. 12, 2025

(54) ENDPOINT DETECTION SYSTEM FOR ENHANCED SPECTRAL DATA COLLECTION

(71) Applicant: APPLIED MATERIALS, INC., Santa Clara, CA (US)

(72) Inventors: Pengyu Han, San Jose, CA (US); Lei Lian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/616,014

(22) Filed: Mar. 25, 2024

(65) Prior Publication Data

US 2024/0230462 A1    Jul. 11, 2024

Related U.S. Application Data

(63) Continuation of application No. 17/344,791, filed on Jun. 10, 2021, now Pat. No. 11,965,798.

(51) Int. Cl.
*G02B 6/04* (2006.01)
*G01B 11/06* (2006.01)
(Continued)

(52) U.S. Cl.
CPC ..... *G01M 11/0207* (2013.01); *G01B 11/0683* (2013.01); *G02B 6/04* (2013.01);
(Continued)

(58) Field of Classification Search
CPC ....... G03F 7/70625; G02B 6/14; G02B 6/132; G02B 6/136; G01B 11/0683
See application file for complete search history.

(56) References Cited

U.S. PATENT DOCUMENTS 6,317,073 B1    11/2001  Tamatsu et al.
7,399,711 B2 *   7/2008  Perry .................. G01B 11/0683
                                                        216/60
(Continued)

FOREIGN PATENT DOCUMENTS

CN    109983483 A     7/2019
CN    111902924 A    11/2020
(Continued)

OTHER PUBLICATIONS

Optics Tutorial, "Optics Tutorial—10—Achromatic Doublets" https://www.youtube.com/watch?v=DspKhNiygDU, Jul. 29, 2013 (Year: 2013).*

(Continued)

*Primary Examiner* — Maurice C Smith
(74) *Attorney, Agent, or Firm* — LOWENSTEIN SANDLER LLP

(57) ABSTRACT

An endpoint detection system for enhanced spectral data collection is provided. An optical bundle is coupled to a light source. The optical bundle includes an emitting optical fiber and a receiving optical fiber disposed at a pairing angle relative to the emitting optical fiber. The optical bundle is coupled to a collimator assembly that receives a light beam of incident light from the emitting optical fiber and directs spectral components of the light beam to first and second portions of a substrate surface. The collimator collects reflected spectral components produced by the spectral components directed to the substrate surface. The collimator assembly transmits the reflected spectral components to the receiving fiber, which transmits the reflected spectral components to a light detection component. A processing device coupled to the light detection component determines a reflectance of the substrate surface based on the reflected spectral components.

20 Claims, 10 Drawing Sheets

(51) Int. Cl.
  *G01M 11/02* (2006.01)
  *G02B 6/136* (2006.01)
  *G02B 27/00* (2006.01)
  *G02B 27/30* (2006.01)
  *G03F 7/00* (2006.01)

(52) U.S. Cl.
  CPC ......... *G02B 6/136* (2013.01); *G02B 27/0025* (2013.01); *G02B 27/30* (2013.01); *G03F 7/70625* (2013.01)

(56) References Cited

U.S. PATENT DOCUMENTS

| | | | |
|---|---|---|---|
| 8,115,912 | B2 | 2/2012 | Kimba |
| 8,554,356 | B2 | 10/2013 | Shimizu et al. |
| 9,176,276 | B2 | 11/2015 | Suijver et al. |
| 11,421,977 | B2 | 8/2022 | Lian et al. |
| 11,501,986 | B2 | 11/2022 | Cheung et al. |
| 2002/0173084 | A1 | 11/2002 | Ohkawa |
| 2004/0073120 | A1 | 4/2004 | Motz et al. |
| 2004/0200574 | A1* | 10/2004 | Davis ............... G05B 19/41875 156/345.24 |
| 2005/0020073 | A1* | 1/2005 | Perry ................ H01J 37/32972 438/689 |
| 2008/0099436 | A1 | 5/2008 | Grimbergen |
| 2012/0009849 | A1 | 1/2012 | Kimba |
| 2013/0281672 | A1 | 10/2013 | Belousov et al. |
| 2015/0039118 | A1 | 2/2015 | Samantaray et al. |
| 2015/0377701 | A1 | 12/2015 | Pawluczyk et al. |
| 2016/0097713 | A1 | 4/2016 | Kester et al. |
| 2018/0173118 | A1 | 6/2018 | Schmitt-Weaver et al. |
| 2018/0322399 | A1 | 11/2018 | Hsiung et al. |
| 2019/0244870 | A1 | 8/2019 | Feng et al. |
| 2019/0286075 | A1 | 9/2019 | Yennie et al. |
| 2019/0286111 | A1 | 9/2019 | Yennie et al. |
| 2019/0348312 | A1 | 11/2019 | Kommisetti et al. |
| 2020/0026196 | A1 | 1/2020 | Luo et al. |
| 2020/0193290 | A1 | 6/2020 | Cho et al. |
| 2020/0324410 | A1 | 10/2020 | Bergantz et al. |
| 2020/0372629 | A1 | 11/2020 | Chen et al. |
| 2021/0103858 | A1 | 4/2021 | Padmanabhan et al. |
| 2021/0407839 | A1 | 12/2021 | Tsujihashi |
| 2022/0065618 | A1 | 3/2022 | Kim et al. |
| 2022/0270237 | A1 | 8/2022 | Sawlani et al. |

FOREIGN PATENT DOCUMENTS

| | | | | |
|---|---|---|---|---|
| JP | H07152000 | A | * | 6/1995 |
| JP | 2000182420 | A | | 6/2000 |
| JP | 2010237194 | A | | 10/2010 |
| WO | WO-2016105704 | A1 | * | 6/2016 ............. B01D 53/30 |
| WO | 2021004725 | A1 | | 1/2021 |
| WO | 2021030833 | A1 | | 2/2021 |
| WO | 2021061541 | A1 | | 4/2021 |
| WO | 2022234831 | A1 | | 11/2022 |

OTHER PUBLICATIONS

International Search Report and Written Opinion for International Application No. PCT/US2022/032879, mailed Sep. 27, 2022, 9 Pages.

International Search Report and Written Opinion for International Application No. PCT/US2022/032882, mailed Sep. 27, 2022, 10 Pages.

Xinbo Q., et al., "Machine Learning Algorithms on Density Prediction of Electron Beam Selective Melted Part," Journal of Mechanical Engineering, 2019, vol. 55(15), pp. 48-55.

* cited by examiner

700

Transmit incident light through an optical bundle 710

Directing a first set of spectral components of a first light beam of the incident light to a first portion of a substrate surface and a second set of spectral components of the first light beam to a second portion of the substrate surface 712

Directing a third set of spectral components of a second light beam of the incident light to a third portion of the substrate surface and a fourth set of spectral components of the second light beam to a fourth portion of the substrate surface 714

Receive a first set of reflected spectral components produced by the first set of spectral components directed to the first portion of the substrate surface and a second set of reflected spectral components produced by the second set of spectral components directed to the second portion of the substrate surface 716

Receive a third set of reflected spectral components produced by the third set of spectral components directed to the third portion of the substrate surface and a fourth set of reflected spectral components produced by the fourth set of spectral components directed to the fourth portion of the substrate surface 718

Determine a reflectance of the substrate surface based on at least one of the first and second sets of reflected spectral components or the third and fourth sets of reflected spectral components 720

Obtain a first metric indicating a reflectance of a surface for a first substrate during a first substrate process performed at a first process chamber of a first manufacturing system 810

Generate training data based on the first metric for the first process chamber 812

Train a machine learning model to predict an endpoint of a substrate process using the generated training data 814

Obtain a second metric indicating a reflectance of a surface for a second substrate during a second substrate process performed at a second process chamber of a second manufacturing system 816

Provide data associated with the second metric as input to the trained machine learning model 818

Determine, based on one or more outputs of the trained machine learning model, that an endpoint criterion associated with the second substrate process is satisfied 820

Terminate the second substrate process at the second process chamber 822

FIG. 8

ENDPOINT DETECTION SYSTEM FOR ENHANCED SPECTRAL DATA COLLECTION

RELATED APPLICATION

This application is a continuation application of, and claims priority to U.S. patent application Ser. No. 17/344,791, filed Jun. 10, 2021, which is incorporated by reference in its entirety herein.

TECHNICAL FIELD

Embodiments of the present disclosure relate, in general, to manufacturing systems and more particularly to an endpoint detection system for enhanced spectral data collection.

BACKGROUND

Manufacturing microelectronics and integrated circuit devices often involves performing numerous operations on semiconductor, dielectric, and conductive substrates. In some instances, monocrystals, semiconductor films, find coatings, and numerous other substances are used in electronic device manufacturing and other practical applications. As atoms of selected types are added (e.g., via deposition) to substrates or removed (e.g., via etching) from the substrates, efficient and precise endpoint monitoring techniques and systems become valuable. Under-processing (e.g., under-deposition, under-etching) as well as over-processing (e.g., over-deposition, over-processing) can result in substandard and malfunctioning devices. Accordingly, optical control systems that allow real-time monitoring of various stages of device manufacturing can significantly improve the quality of products and are especially useful given the constant increasing demands of quality semiconductor devices.

SUMMARY

Some of the embodiments described cover an endpoint detection system. The endpoint detection system includes a light source component configured to generate incident light. The endpoint detection system further includes an optical bundle coupled to the light source. The optical bundle includes a first set of optical fibers including a first emitting optical fiber and a first receiving optical fiber. The first emitting optical fiber is disposed at a pairing angle relative to the first receiving optical fiber. The optical bundle further includes a second set of optical fibers including a second emitting optical fiber and a second receiving optical fiber. The second emitting optical fiber is disposed at the pairing angle relative to the second receiving optical fiber. The first emitting optical fiber and the second emitting optical fiber are configured to receive the incident light from the light source. The endpoint detection system further includes a collimator assembly coupled to the optical bundle, the collimator assembly including an achromatic lens. The achromatic lens is configured to responsive to receiving a first light beam of the incident light from the first emitting optical fiber, direct a first set of spectral components of the first light beam to a first portion of a substrate surface. The achromatic lens is further configured to direct a second set of spectral components of the first light beam to a second portion of the substrate surface. The first portion is substantially the same as the second portion. The achromatic lens is further configured to collect a first set of reflected spectral components of light and a second set of reflected spectral components of light from the substrate surface. The set of reflected spectral components of light is produced by the first set of spectral components directed onto the first portion of the substrate surface and the second set of reflected spectral components of light is produced by the second set of spectral components directed onto the second portion of the substrate surface. The achromatic lens is further configured to transmit the first set of reflected spectral components and the second set of reflected spectral components to the first receiving optical fiber of the optical fiber bundle. The optical bundle further includes a light detection component coupled to the optical bundle. The light detection component is configured to receive the first set of reflected spectral components and the second set of reflected spectral components from the first receiving optical fiber. The optical bundle further includes a processing device communicatively coupled to the light detection component. The processing device is configured to determine a reflectance of the substrate surface based on the first set of reflected spectral components and the second set of reflected spectral components.

In some embodiments, a manufacturing system is provided. The manufacturing system includes processing chamber and a substrate disposed within the processing chamber. The manufacturing system further includes an endpoint detection system coupled to the processing chamber and configured to determine a reflectance of a surface of the substrate. The endpoint detection system includes a light source component configured to generate incident light. The endpoint detection system further includes an optical bundle coupled to the light source. The optical bundle includes a first set of optical fibers including a first emitting optical fiber and a first receiving optical fiber. The first emitting optical fiber is disposed at a pairing angle relative to the first receiving optical fiber. The optical bundle further includes a second set of optical fibers including a second emitting optical fiber and a second receiving optical fiber. The second emitting optical fiber is disposed at the pairing angle relative to the second receiving optical fiber. The first emitting optical fiber and the second emitting optical fiber are configured to receive the incident light from the light source. The endpoint detection system further includes a collimator assembly coupled to the optical bundle, the collimator assembly including an achromatic lens. The achromatic lens is configured to responsive to receiving a first light beam of the incident light from the first emitting optical fiber, direct a first set of spectral components of the first light beam to a first portion of a substrate surface. The achromatic lens is further configured to direct a second set of spectral components of the first light beam to a second portion of the substrate surface. The first portion is substantially the same as the second portion. The achromatic lens is further configured to collect a first set of reflected spectral components of light and a second set of reflected spectral components of light from the substrate surface. The set of reflected spectral components of light is produced by the first set of spectral components directed onto the first portion of the substrate surface and the second set of reflected spectral components of light is produced by the second set of spectral components directed onto the second portion of the substrate surface. The achromatic lens is further configured to transmit the first set of reflected spectral components and the second set of reflected spectral components to the first receiving optical fiber of the optical fiber bundle. The optical bundle further includes a light detection component coupled to the optical bundle. The light detection component is configured to receive the first set of reflected spectral components and the second set of reflected spectral components from the first receiving optical fiber. The optical bundle further includes a processing device communicatively coupled to the light detection component. The processing device is configured to determine a reflectance of the substrate surface based on the first set of reflected spectral components and the second set of reflected spectral components.

In some embodiments, a method for enhanced spectral data collection is provided. The method includes transmitting incident light through a first emitting optical fiber of a first set of optical fibers of an optical bundle and a second emitting optical fiber of a second set of optical fibers of the optical bundle. The first set of optical fibers further includes a first receiving optical fiber that is disposed at a pairing angle relative to the first emitting optical fiber. The second set of optical fibers further includes a second receiving optical fiber that is disposed at the pairing angle relative to the second emitting optical fiber. The method further includes directing, through an achromatic lens of a collimator assembly, a first set of spectral components of a first light beam of the incident light transmitted through the first emitting optical fiber to a first portion of a substrate surface and a second set of spectral components of the first light beam to a second portion of the substrate surface. The first portion is substantially the same as the second portion. The method further includes receiving, from a light detection component coupled to the optical bundle, a first set of reflected spectral components and a second set of reflected spectral components collected by the achromatic lens of the collimator assembly. The first set of reflected spectral components is produced by the first set of spectral components directed onto the first portion of the substrate surface. The second set of reflected spectral components is produced by the second set of spectral components directed onto the second portion of the substrate surface. The first set of reflected spectral components and the second set of reflected spectral components are transmitted from the achromatic lens to the light detection component via the first receiving optical fiber of the first set of optical fibers. The method further includes determining a reflectance of the surface of the substrate based on the first set of reflected spectral components and the second set of reflected spectral components.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 7 is a flow chart of a method for collecting spectral data by an endpoint detection system, according to aspects of the present disclosure.

FIG. 8 is a flow chart for a method of training a machine learning model using spectral data collected by endpoint detection systems at multiple process chambers, according to aspects of the present disclosure.

DETAILED DESCRIPTION OF EMBODIMENTS

Figure 1:
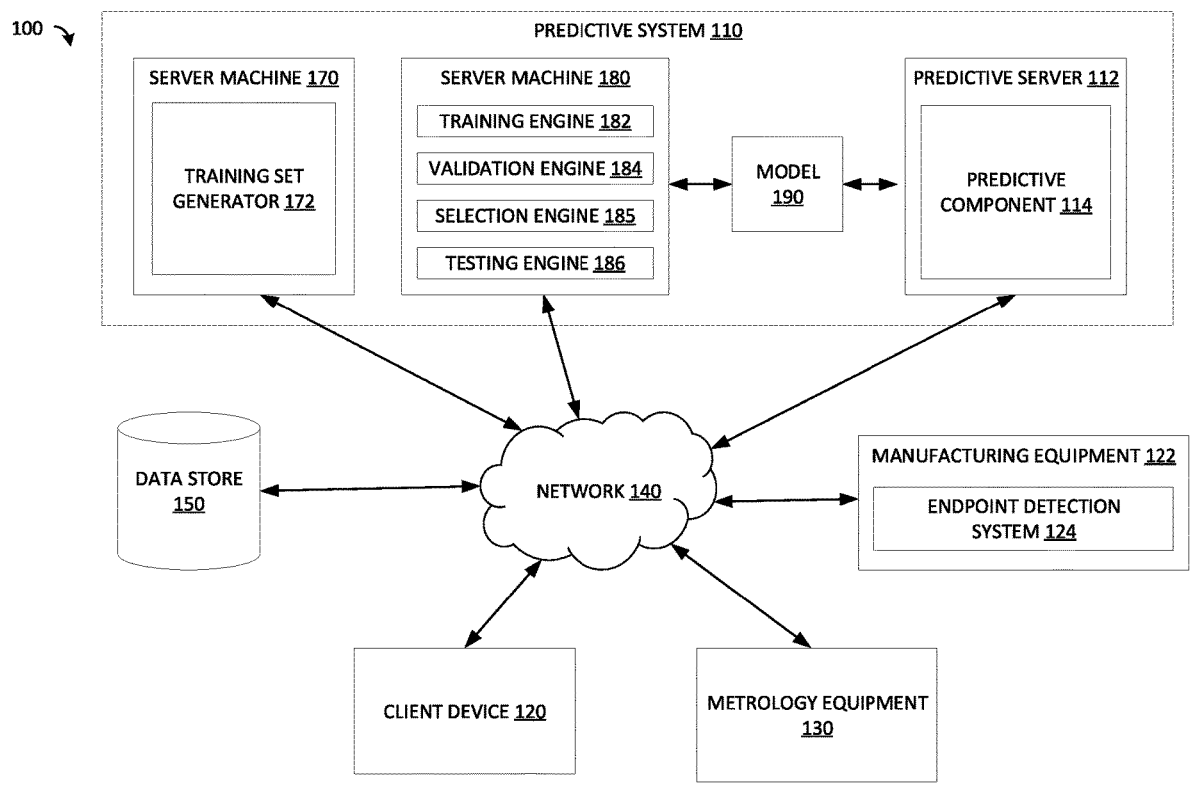
FIG. 1 depicts an illustrative computer system architecture, according to aspects of the present disclosure.

Embodiments of the present disclosure are directed to an endpoint detection system for enhanced spectral data collection. A substrate process (e.g., a deposition process, an etch process, etc.) can be performed for a substrate at a process chamber of a manufacturing system. An endpoint of a substrate process refers to a point of the process at which a profile of the substrate corresponds to (i.e., matches or substantially matches) a target substrate profile. For example, a mask including a pattern for a target substrate profile can be used during an etching process for a substrate, such as a silicon wafer. The mask can be placed on a surface of the wafer and exposed to a reactive (e.g., wet or dry etching) environment to remove portions of the substrate that are not protected by the mask. And endpoint of the etch process refers to a point of the etch process at which the profile of the substrate corresponds to the pattern for the target substrate profile provided by the mask.

Deviations from a process procedure can result in variations on the speed and/or uniformity of a substrate process. For example, changes in an etching environment or differences in photomask patterns can result in variations in the speed and uniformity of etching, both across the surface of a substrate and between etch processes for multiple substrates. Tracking and responding to such changes involves precise and adjustable optical endpoint systems capable of collecting accurate and substantial optical response data that characterizes the surface of a substrate at various time periods during the substrate process. The goal of accuracy is further driven by shrinking dimensions of microelectronic devices, increasingly complex designs of photomasks, and raising demands for device uniformity. Existing optical systems for endpoint control are often incapable of meeting such increased technological demands.

Aspects and implementations of the present disclosure address this and other shortcomings of conventional technologies by providing an endpoint detection system for enhanced spectral data collection. The endpoint detection system can be coupled to or disposed within a process chamber and can be configured to collect spectral data for a substrate during a substrate process. Spectral data refers to data associated with an intensity (i.e., a strength or amount of energy) for a detected wave of energy for each wavelength of light reflected from a surface of the substrate. An optical bundle of the endpoint detection system is coupled to a light source component, a light detector, and a collimator assembly. The optical bundle includes at least a first set of optical fibers that includes a first emitting fiber and a first receiving fiber that is disposed at a pairing angle with respect to the first emitting fiber. The optical bundle further includes at least a second set of optical fibers that includes a second emitting fiber and a second receiving fiber that is disposed at the pairing angle with respect to the first emitting fiber. The pairing angle is between approximately 175 and approximately 180 degrees.

The light source generates incident light and transmits the incident light to the collimator assembly via the first emitting fiber and the second emitting fiber. The collimator assembly includes an achromatic lens configured to convert the incident light transmitted by the first emitting fiber to a first incident light beam and the incident light transmitted by the second emitting fiber to a second indecent light beam. Each incident light beam has a uniform spatial profile within a broad range of wavelengths. Each light beam can include multiple sets of spectral components each associated with different ranges of wavelengths. The collimator assembly directs a first set of spectral components of the first light beam to a first portion of a surface of the substrate and a second set of spectral components of the first light beam to a second portion of the substrate surface. The collimator assembly also directs a first set of spectral components of the second light beam to a third portion of a surface of the substrate and a second set of spectral components of the second light beam to a fourth portion of the substrate surface.

A first reflected light beam and a second reflected light beam are transmitted from the substrate surface to the achromatic lens. The first reflected light beam includes a first set of reflected spectral components produced by the first set of spectral components of the first light beam and a second set of reflected spectral components produced by the second set of spectral components of the first light beam. The second reflected light beam includes a first set of reflected spectral components produced by the first set of spectral components of the second light beam and a second set of reflected spectral components produced by the second set of spectral components of the second light beam. The achromatic lens transmits the first reflected light beam to the first receiving fiber and the second reflected light beam to the second receiving fiber of the optical bundle. The light detector coupled to the optical bundle receives the first and second reflected light beams, which determines (e.g., via a processing device coupled to the light detector) a reflectance of the first portion and the second portion of the substrate surface. The determined reflectance can be the basis of or can be included in spectral data for the substrate, which can be used to detect the endpoint of the substrate process.

The endpoint detection system of the present disclosure provides enhanced spectral data collection that is not possible with conventional endpoint detection systems. The optical bundle of the endpoint detection system of the present disclosure enables the transmission of multiple incident light signals from the light source component to the substrate surface as well as the transmission of multiple reflected light signals from the substrate surface to the light detector without the use of additional equipment (e.g., a beam splitter) that can reduce the power of the transmitted signal. As such, the optical bundle collects reflected light more efficiently, reduces signal loss of the reflected light beam, and ensures that the reflected light signal has an overall larger magnitude than a conventional fiber optic cable. The collimator assembly of the endpoint detection system generates beams of incident light that have a uniform spatial profile for a broad range of wavelengths. For example, the width of an incident light beam can be the same for a 250 nm spectral component of the beam as well as for a 750 nm spectral component of the beam. The enhanced uniformity ensures a more accurate measurement of the optical response of a target portion of a substrate surface inside the process chamber, and therefore offers more accurate data that allows for a more precise determination of the state of a substrate profile during the substrate process.

FIG. 1 depicts an illustrative computer system architecture 100, according to aspects of the present disclosure. Computer system architecture 100 includes a client device 120, manufacturing equipment 122, metrology equipment 130, a predictive server 112 (e.g., to generate predictive data, to provide model adaptation, to use a knowledge base, etc.), and a data store 150. The predictive server 112 can be part of a predictive system 110. The predictive system 110 can further include server machines 170 and 180. In some embodiments, computer system architecture 100 can include or be a part of a manufacturing system for processing substrates, such as manufacturing system 200 of FIG. 2.

Components of the client device 120, manufacturing equipment 122, metrology equipment 130, predictive system 110, and/or data store 150 can be coupled to each other via a network 140. In some embodiments, network 140 is a public network that provides client device 120 with access to predictive server 112, data store 150, and other publically available computing devices. In some embodiments, network 140 is a private network that provides client device 120 access to manufacturing equipment 122, metrology equipment 130, data store 150, and other privately available computing devices. Network 140 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc.

Manufacturing equipment 122 can produce products following a recipe or performing runs over a period of time. In some embodiments, manufacturing equipment 122 can include or be a part of a process tool that includes one or more stations (e.g., process chamber, transfer chamber, load lock, etc.) configured to perform a different function for a substrate. Manufacturing equipment 122 can further include an endpoint detection system 124 that is configured to detect an endpoint of a process performed for a substrate at manufacturing equipment 122. An endpoint of a substrate process refers to a point of the process at which a profile of the substrate corresponds to (i.e., matches or substantially matches) a target profile. Endpoint detection system 124 can include one or more components configured to collect and/or generate spectral data associated with one or more portions of a profile of the substrate during a substrate process. Spectral data refers to data associated with an intensity (i.e., a strength or amount of energy) for a detected wave of energy for each wavelength of the detected wave.

In some embodiments, endpoint detection system 124 can include an optical fiber bundle and a collimator assembly that are configured to direct incident light from a light source to a surface of a substrate and transmit reflected light from the surface of the substrate to a light detection component. A processing device of endpoint detection system 124 can generate the spectral data for the profile of the substrate based on the reflected light transmitted to the light detection component. The processing device of endpoint detection system 124 can determine whether the endpoint of the substrate process is reached based on the spectral data. In response to determining that the endpoint of the substrate process is reached, endpoint detection system 124 can terminate the substrate process at the process chamber. Further details regarding endpoint detection system 124 are provided with regard to FIG. 3.

In some embodiments, one or more stations of manufacturing equipment 122 can include sensors configured to generate and/or collect sensor data associated with manufacturing equipment 122. Sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing equipment 122, or process parameters of the manufacturing equipment 122. The sensor data can be provided while the manufacturing equipment 122 is performing a substrate process. The sensor data can be different for each substrate.

In some embodiments, computer system architecture 100 can include metrology equipment 130. Metrology equipment 130 can be configured to generate metrology data associated with substrates processed by manufacturing equipment 122. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

In some embodiments, metrology equipment 130 can include metrology measurement devices that are separate (i.e., external) from manufacturing equipment 122. For example, metrology equipment 130 can be standalone equipment that is not coupled to any station of manufacturing equipment 122. In such embodiments, a user of a manufacturing system (e.g., an engineer, an operator) can remove a substrate processed at manufacturing equipment 122 from manufacturing equipment 122 and transfer the substrate to metrology equipment 130 for measurement. In some embodiments, metrology equipment 130 can transfer metrology data generated for the substrate to the client device 120 coupled to metrology equipment 130 via network 140. In other or similar embodiments, a user of the manufacturing system can obtain metrology data for the substrate from metrology equipment 130 and can provide the metrology data to computer system architecture via a graphical user interface (GUI) of client device 120. In additional or alternative embodiments, metrology equipment 130 can be included as part of manufacturing equipment 122. For example, metrology equipment 130 can be included in a vacuum environment of a process tool of manufacturing equipment 122 (i.e., coupled to a transfer chamber). Such metrology equipment is referred to as inline metrology equipment. In another example, metrology equipment 130 can be included in a non-vacuum environment of the process tool (i.e., coupled to a factory interface). Such metrology equipment is referred to as integrated metrology equipment.

Data store 150 can be a memory (e.g., random access memory), a drive (e.g., a hard drive, a flash drive), a database system, or another type of component or device capable of storing data. Data store 150 can include multiple storage components (e.g., multiple drives or multiple databases) that can span multiple computing devices (e.g., multiple server computers). The data store 150 can store spectral data, non-spectral data (e.g., sensor data), metrology data, predictive data, and so forth. Spectral data can include historical spectral data (e.g., spectral data generated for a previous substrate processed at manufacturing equipment 122 or at other manufacturing equipment coupled to data store 150 via network 140) and/or current spectra (spectral data generated for a current substrate being processed at manufacturing equipment 122). Current spectral data can be data for which predictive data is generated, in some embodiments. In some embodiments, metrology data can include historical metrology data (e.g., metrology measurement values for a prior substrate processed at the manufacturing equipment 122 or at other manufacturing equipment). Data store 150 can also store contextual data associated with a substrate being processed at the manufacturing system (e.g., recipe name, recipe step number, preventive maintenance indicator, operator, etc.).

In some embodiments, data store 150 can be configured to store data that is not accessible to a user (e.g., an operator, an engineer, etc.) of the manufacturing system. For example, spectral data, non-spectral data, and/or contextual data obtained for a substrate being processed at the manufacturing system is not accessible to a user of the manufacturing equipment 122. In some embodiments, all data stored at data store 150 can be inaccessible by the user, while in other or similar embodiments, a portion of data stored at data store 150 is inaccessible by the user while another portion of data stored at data store 150 is accessible to the user. In some embodiments, inaccessible data at data store 150 can be encrypted using an encryption mechanism that is unknown to the user (e.g., data is encrypted using a private encryption key). In other or similar embodiments, data store 150 can include multiple data stores where data that is inaccessible to the user is stored in one or more first data stores and data that is accessible to the user is stored in one or more second data stores.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190 or set of machine learning models 190. In some embodiments, the training set generator 172 can partition the training data into a training set, a validating set, and a testing set.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190 or a set of machine learning models 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can include a linear regression model, a partial least squares regression model, a Gaussian regression model, a random forest model, a support vector machine model, a neural network, a ridge regression model, and so forth.

Validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 185 can be capable of selecting a trained machine learning model 190 that has an accuracy that meets a threshold accuracy. In some embodiments, the selection engine 185 can be capable of selecting the trained machine learning model 190 that has the highest accuracy of the trained machine learning models 190. The testing engine 186 can be capable of testing a trained machine learning model 190 using a corresponding set of features of a testing set from data set generator 172. For example, a first trained machine learning model 190 that was trained using a first set of features of the training set can be tested using the first set of features of the testing set. The testing engine 186 can determine a trained machine learning model 190 that has the highest accuracy of all of the trained machine learning models based on the testing sets.

Predictive server 112 includes a predictive engine 114 that is capable of running trained machine learning model 190 on one or more inputs to obtain one or more outputs. For example, predictive component 114 can provide spectral data and/or non-spectral data for a portion of a current substrate being processed at a manufacturing equipment 122 as input to trained machine learning model 190 and run trained machine learning model 190 on the input to obtain one or more outputs. In some embodiments, the output(s) can include data that indicates whether a current process for the current substrate has reached an endpoint. For example, the one or more outputs can include metrology data for the current substrate. The metrology data can be used (e.g., by endpoint detection system 124) to determine whether the endpoint of the current substrate process is reached.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
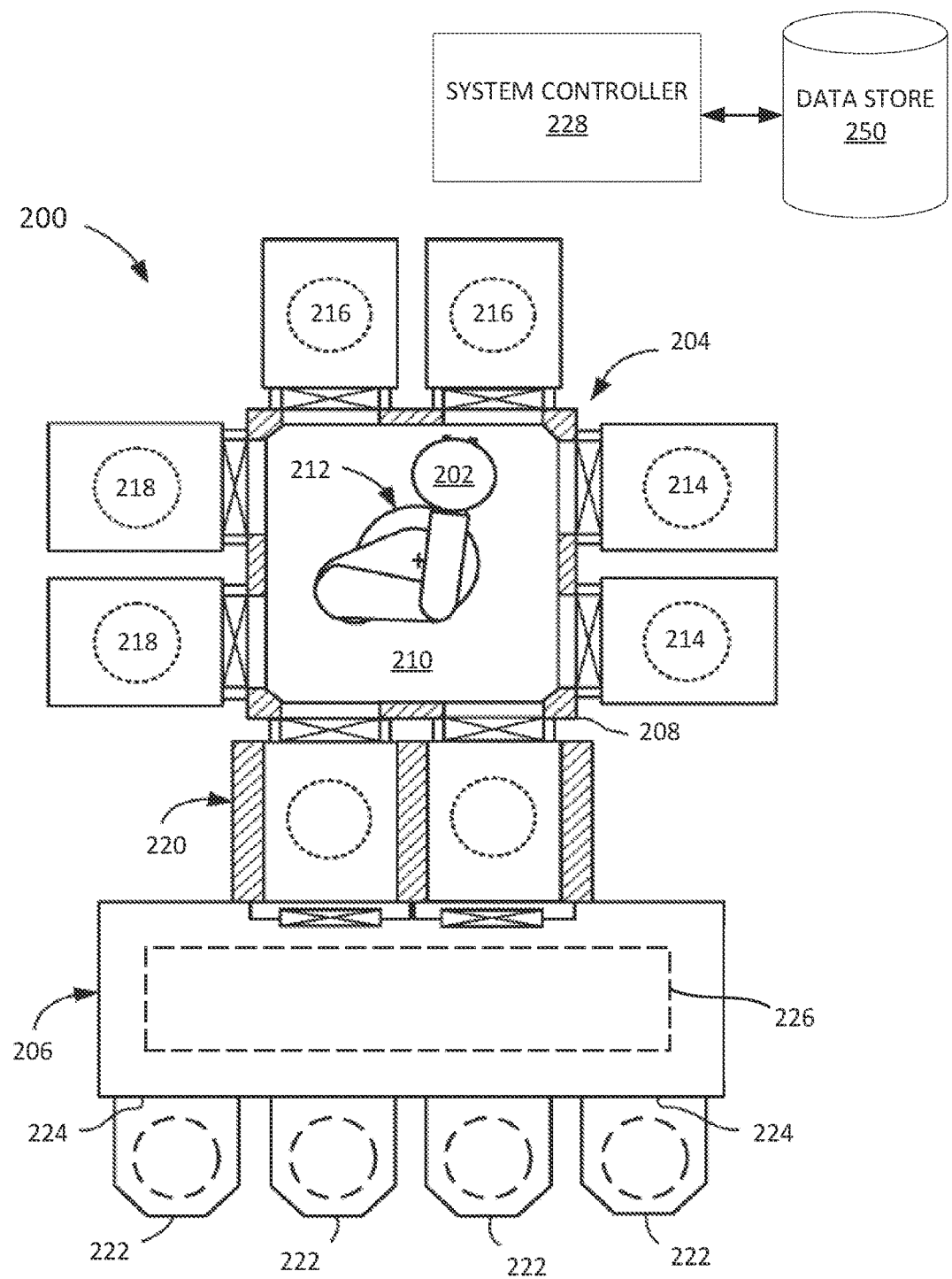
FIG. 2 is a top schematic view of an example manufacturing system, according to aspects of the present disclosure.

FIG. 2 is a top schematic view of an example manufacturing system 200, according to aspects of the present disclosure. Manufacturing system 200 can perform one or more processes on a substrate 202. Substrate 202 can be any suitably rigid, fixed-dimension, planar article, such as a silicon-containing disc or wafer, a patterned wafer, a glass plate, or the like, suitable for fabricating electronic devices or circuit components thereon.

Manufacturing system 200 can include a process tool 204 and a factory interface 206 coupled to process tool 204. Process tool 204 can include a housing 208 having a transfer chamber 210 therein. Transfer chamber 210 can include one or more processing chambers (also referred to as process chambers) 214, 216, 218 disposed therearound and coupled thereto. Processing chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. In some embodiments, endpoint detection equipment, such as that of endpoint detection system 124 described with respect to FIG. 1, can be coupled to or disposed within a process chamber 214, 216, 218, as described herein.

A load lock 220 can also be coupled to housing 208 and transfer chamber 210. Load lock 220 can be configured to interface with, and be coupled to, transfer chamber 210 on one side and factory interface 206. Load lock 220 can have an environmentally-controlled atmosphere that can be changed from a vacuum environment (wherein substrates can be transferred to and from transfer chamber 210) to an inert-gas environment that is at or near atmospheric-pressure (wherein substrates can be transferred to and from factory interface 206) in some embodiments.

Factory interface 206 can be any suitable enclosure, such as, e.g., an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between substrate carriers (also referred to as containers) 222 and load lock 220. In other and/or similar embodiments, factory interface 206 can be configured to receive replacement parts from replacement parts storage containers 222.

Manufacturing system 200 can also be connected to a client device (e.g., client device 120 of FIG. 1) that is configured to provide information regarding manufacturing system 200 to a user (e.g., an operator). In some embodiments, the client device can provide information to a user of manufacturing system 200 via one or more graphical user interfaces (GUIs). For example, the client device can provide information regarding an endpoint of a substrate process performed at process chamber 214, 216, 218 via a GUI.

Manufacturing system 200 can also include or be coupled to a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 200 in accordance with a process recipe. The instructions can be stored on a computer readable storage medium, which can include the main memory, static memory, secondary storage and/or processing device (during execution of the instructions).

In some embodiments, a processing device of endpoint detection system 124 can correspond to system controller 228. In such embodiments, system controller 228 can receive spectral data from equipment of endpoint detection system 124 during substrate processes at processing chambers 214, 216, 218. System controller 228 can determine, based on the received spectral data, whether an endpoint of a substrate process has been reached at process chambers 214, 216, 218, in accordance with embodiments described herein. In other or similar embodiments, the processing device of endpoint detection system 124 can be separate from system controller 228. Accordingly, in response to detecting an endpoint of a substrate process, endpoint detection system 124 can transmit an instruction to system controller 228 that causes system controller 228 to terminate a substrate process at a respective process chamber 314, 316, 318.

Spectral data received from equipment of endpoint detection system 124, or any other component of manufacturing system 200, can be stored in a data store 250. Data store 250 can be included as a component within system controller 228 or can be a separate component from system controller 228. In some embodiments, data store 250 can be or include a portion of data store 150, as described with respect to FIG. 1.

Figure 3:
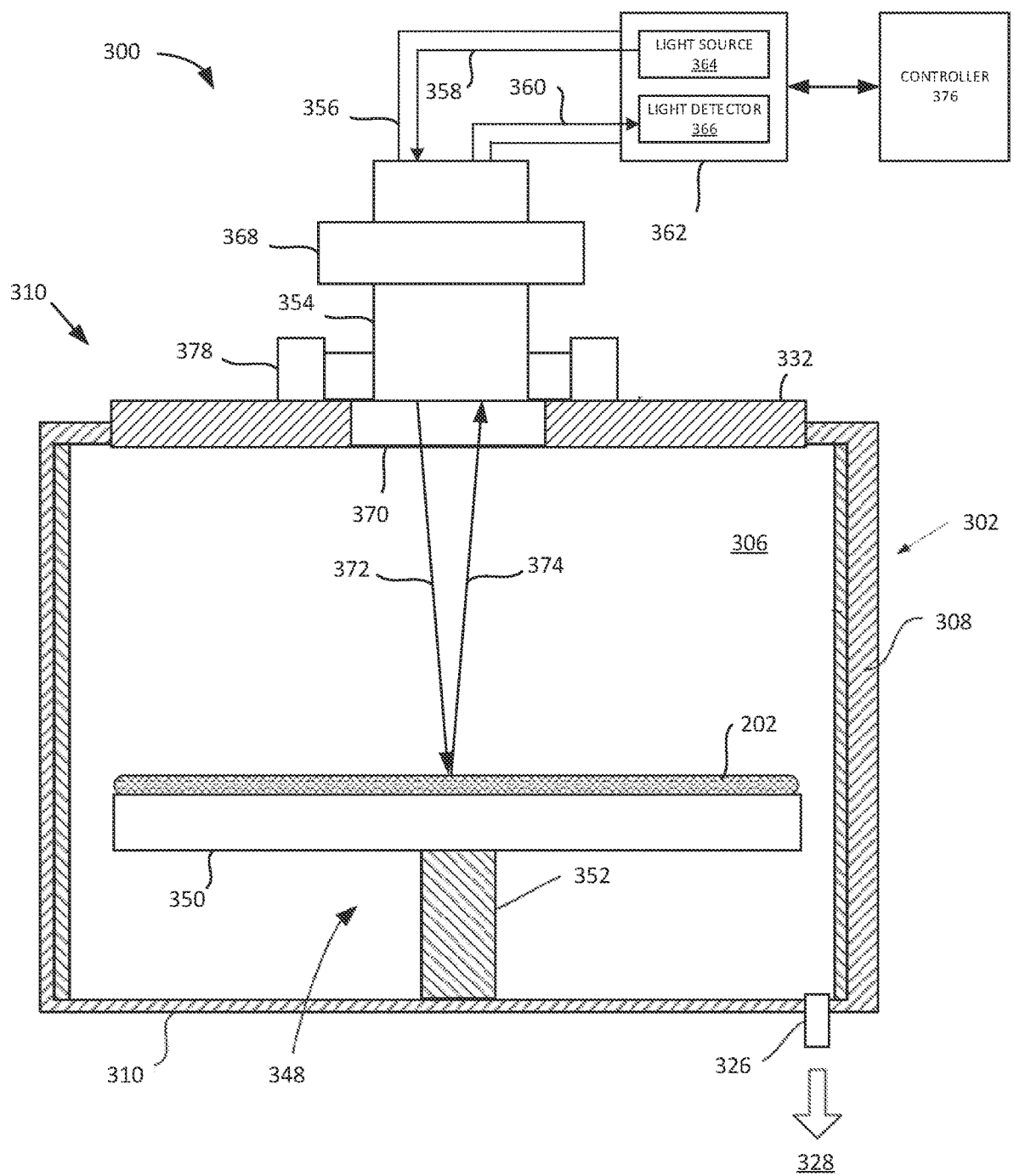
FIG. 3 illustrates an endpoint detection system, according to aspects of the present disclosure.

FIG. 3 illustrates an endpoint detection system 300 coupled to a process chamber 310, according to aspects of the present disclosure. Endpoint detection system 300 can correspond to endpoint detection system, 124, described with respect to FIG. 1. Process chamber 310 can correspond to any of process chambers 214, 216, 218, described with respect to FIG. 2. In some embodiments, process chamber 310 can be used for processes in which a corrosive plasma environment is provided. For example, the process chamber 310 can be a chamber for a plasma etcher or plasma etch reactor, a plasma cleaner, and so forth. In other or similar embodiments, process chamber 310 can be used for processes in which a non-corrosive environment is provided. For example, process chamber 310 can be used as a chemical vapor deposition (CVD) chamber, a physical vapor deposition (PVD) chamber, an atomic layer deposition (ALD) chamber, an ion assisted deposition (IAD) chamber, and other types of processing chambers. Process chamber 310 can be configured to perform a process for substrate 202, as described above.

Briefly, process chamber 310 includes a chamber body 302 and a lid 330 and/or a showerhead (not shown) that encloses an interior volume 306. Chamber body 302 generally includes sidewalls 308 and a bottom 312. The showerhead can include a showerhead base and a showerhead gas distribution plate. The lid 330 and/or the showerhead can be supported on sidewall 308 of the chamber body 302. The showerhead (or lid 330) can be opened to allow access to the interior volume 306 of process chamber 310, and can provide a seal for the process chamber 310 while closed. A gas panel (not shown) can be coupled to process chamber 310 to provide process and/or cleaning gases to interior volume 306 through lid 330 and a nozzle (e.g., through apertures of the showerhead or lid and nozzle) and/or the showerhead. An exhaust port 326 can be defined in chamber body 302, and can couple interior volume 306 to a pump system 328. Pump system 328 can include one or more pumps and throttle valves utilized to evacuate and regulate the pressure of interior volume 306 of process chamber 310. A substrate support assembly 348 is disposed in interior volume 306 and beneath lid 330 and/or the showerhead. Substrate support assembly 348 holds substrate 202 during processing. In one embodiment, substrate support assembly 348 includes a pedestal 352 that supports an electrostatic chuck 350.

Endpoint detection system 300 can be configured to optically monitor an environment of interior volume 306 during a substrate process. As illustrated in FIG. 3, endpoint detection system 300 can be mechanically coupled to chamber body 302 and optically interfaced (i.e., via chamber interface 370) with the environment of interior volume 306. In other or similar embodiment, one or more components of endpoint detection system 300 can be disposed within the environment of interior volume 306. Endpoint detection system 300 can include a collimator assembly 354, an optical fiber bundle 356, a light component 362, a processing device 376 and, in some embodiments, a polarizer component 368. As illustrated in FIG. 3, collimator assembly 354 can be coupled to chamber interface 370. In some embodiments, chamber interface 370 can be an orifice, a converging or diverging lens, a transparent slab, or any other device or material that is capable of transferring light between collimator assembly 354 and the environment of interior volume 306. It should be noted that although FIG. 3 depicts chamber interface 370 as being embedded within lid 332, chamber interface 370 can be embedded within or coupled to any portion of process chamber 310 (e.g., sidewall 308, bottom 312, etc.).

A first end of optical bundle 356 can be coupled to collimator assembly 354 and a second end of optical bundle 356 can be coupled to light component 362. Optical bundle 356 can include one or more emitting fibers 358 and one or more receiving fibers 360 disposed within an insulating material of optical bundle 356. Further details regarding optical bundle 356 are provided herein. Light component 362 can include a light source 364 configured to generate light. Herein, "light" refers to electromagnetic radiation of any spectral range, including visible, far and near infrared (IR), far and near ultraviolet (UV), and so forth. "Light" can further include unpolarized (e.g., natural) light, linearly, circularly, or elliptically polarized light, partially-polarized light, focused light, diverging light, collimated light, and so on. In some embodiments, light source 364 can include a narrow-band light source, such as a light-emitting diode (LED), a laser, a light bulb, etc. In other or similar embodiments, light source 364 can include a broadband light source. Light source 364 can include more than one component light sources, such as multiple narrow-band light sources producing (when taken together) a broadband light input, in some embodiments. Light source 364 can include additional optical elements (i.e., filters, absorbers, polarizers, etc.) to control a spectral distribution and/or polarization of the light.

Light generated by light source 364 (referred to as incident light herein) can be transmitted to collimator assembly 354 through one or more emitting optical fibers 358 of optical bundle 356. In response to receiving the incident light via emitting optical fibers 358, collimator assembly 354 can be configured to convert the incident light into one or more incident light beams 372. For example, the incident light can pass via one or more optical elements of collimator assembly 354, such as lenses, reflectors, filters, apertures, and so forth. In some embodiments, spatial properties of the light beam produced by collimator assembly 354 can be the same for multiple spectral components of light beam 372. For example, a diameter of light beam 372 can be the same within a broad range of wavelengths $\lambda$ of various spectral components contained in the incident light and, therefore in light beam 372. In existing endpoint detection systems, the diameter of a conventional light beam can vary depending on the wavelength $\lambda$. For example, a green component ($\lambda=550$ nm) can have a diameter of 9 nm, whereas a red component ($\lambda=650$ nm) can have a diameter of 13 nm. As a result, different spectral components propagate along different optical paths. This can result in a significant error in the obtained reflectivity $R(\lambda)$ of the substrate, which can therefore lead to mischaracterization of the surface of substrate 202. In contrast, collimator assembly 354 can generate light beam 372 such that a diameter of the light beam is the same across the broad range of wavelengths $\lambda$. In some embodiments, collimator assembly 354 can include one or more achromatic lenses. In such embodiments, the light beam 372 generated by collimator assembly 354 can be an achromatic light beam. Further details regarding collimator assembly 354 are provided with respect to FIGS. 4A-4B.

As illustrated in FIG. 3, in some embodiments, collimator assembly 354 can include a polarizer component 368. Polarizer component 368 is configured to polarize unpolarized (e.g., natural) light generated by light source 364. For example, polarizer component 368 can convert unpolarized incident light into linearly, circularly, or elliptically polarized light. It should be noted that although FIG. 3 illustrates polarizer component 368 as being part of collimator assembly 354, polarizer component 568 can be coupled to any portion of endpoint detection system 300 that passes incident light to chamber interface 370. For example, polarizer component 368 can be coupled to an outlet of light source 364, to an outlet of the one or more emitting optical fibers 358, between collimator assembly and chamber interface 370, etc.

Collimator 354 can direct light beam 372 to a surface of substrate 202 disposed on substrate support assembly 348 via chamber interface 370. Light beam 372 can be reflected off the surface of substrate 202 as reflected light beam 374, which is received by collimator assembly 354. One or more receiving optical fibers 360 of optical bundle 356 can transmit reflected light beam 374 to light detector 366 of light component 362. Light detector 366 can include one or more spectrographs, spectrometers, diffraction gratings, mirrors, lenses, photodiodes, and other devices. Light detector 366, alone or in conjunction with processing device 376, can determine one or more optical responses associated with the surface of substrate 202 based on reflected light beam 374. For example, light detector 366 and/or processing device 376 can determine a reflectivity $R(\lambda)$, a refraction index $n(\lambda)$, or any other optical quantity that can be used to characterize substrate 202 based on reflected light 374. In some embodiments, the optical responses can be used to characterize, for substrate 202, a polarization dependence of the reflectivity, an angle of rotation of the polarization plane upon reflection, luminescence intensity, and so on. Spectral data, as described with respect to this application, can refer to data corresponding to the optical responses of reflected light 374 and/or the optical characteristics for substrate 202 derived from the optical responses of reflected light 374.

In some embodiments, processing device 376 can be included as part of a system controller (e.g., system controller 228) for a manufacturing system including process chamber 310. In such embodiments, processing device 376 can store the spectral data generated for substrate 202 at a data store coupled to processing device 376 (e.g., data store 250, etc.). In other or similar embodiments, processing device 376 can be a processing component that is separate from system controller 228 but is coupled to system controller 228 via a network. Processing device 376 can transmit the generated spectral data to system controller 228 for storage at a respective data store of manufacturing system 200.

In some embodiments, collimator assembly 354 can be equipped with a tilt adjustment mechanism 378 to allow adjustment of an optical axis of the collimator. In some embodiments, tilt mechanism 378 can facilitate centering of collimator assembly 354 after maintenance or to ensure chamber-to-chamber consistency. In other or similar embodiments, tilt mechanism 378 can facilitate adjustment of the optical axis to collect spectral data for a portion of the substrate surface that is off center (e.g., an edge portion of the substrate surface, etc.).

Figure 4A:
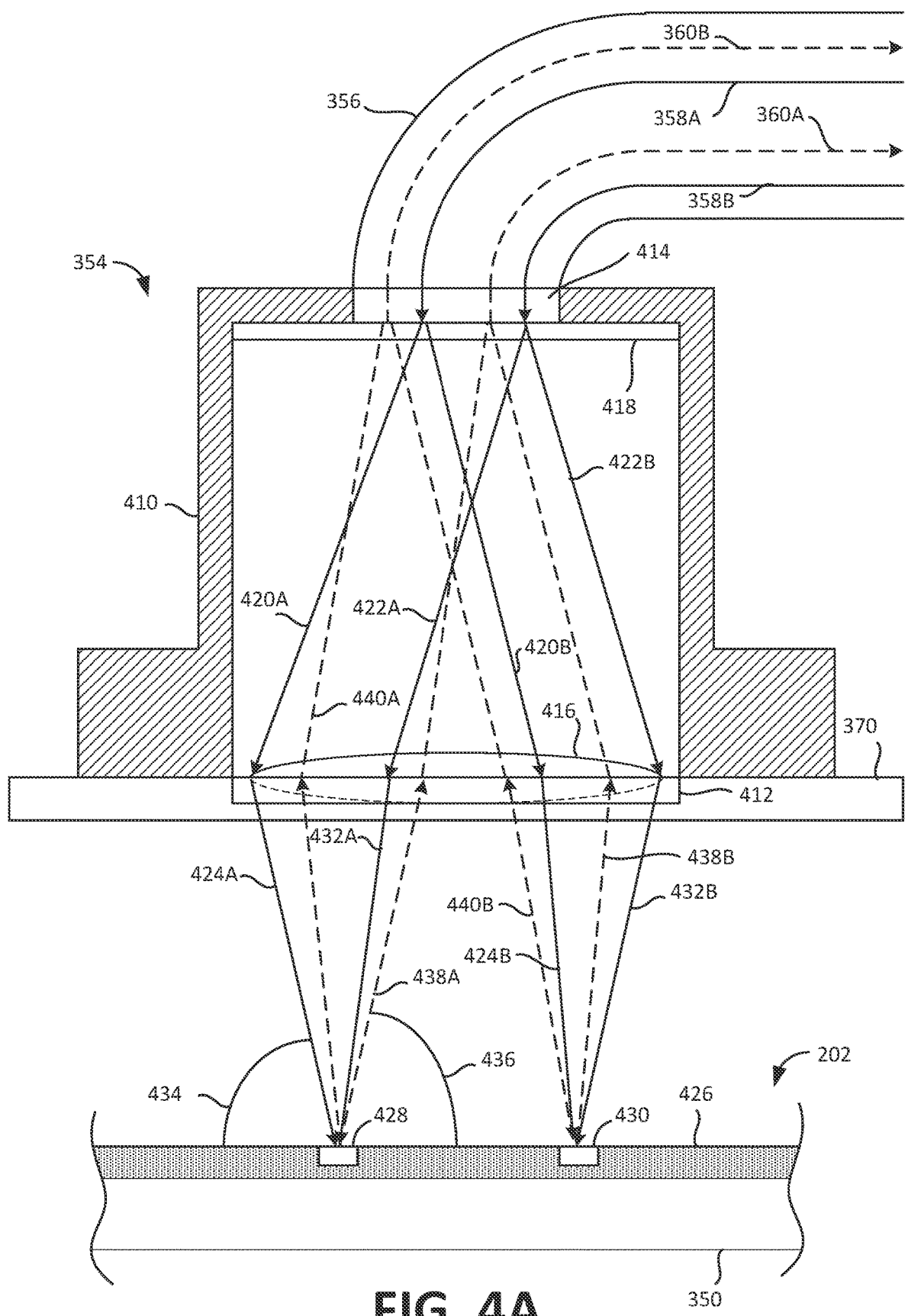
FIGS. 4A-4B illustrate an optical bundle and an achromatic assembly of an endpoint detection system, according to aspects of the present disclosure.
Figure 4B:
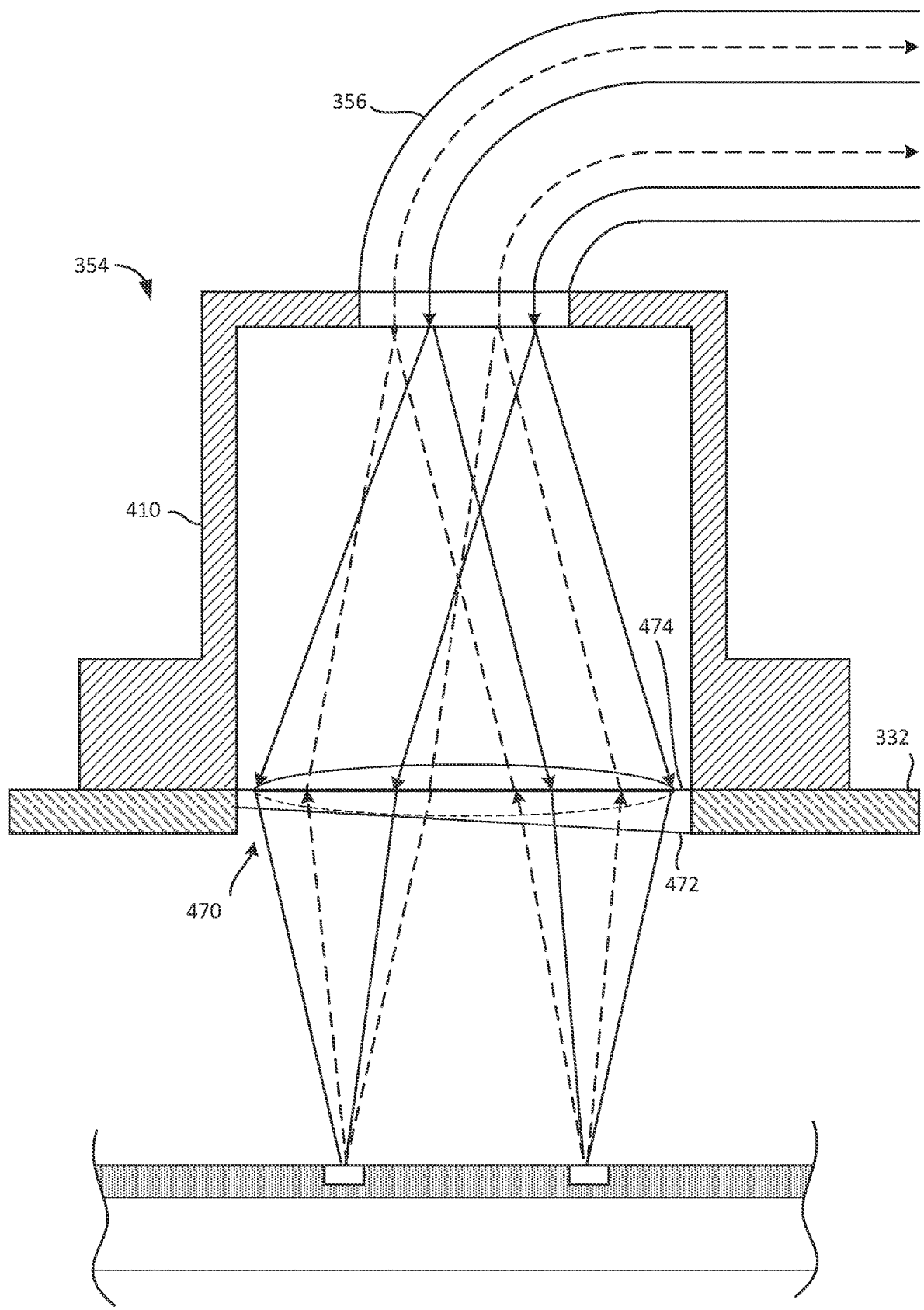

FIGS. 4A-4B illustrate a collimator assembly 354 and an optical bundle 356 of an endpoint detection system 300, according to aspects of the present disclosure. As described with respect to FIG. 3, collimator assembly 354 can be coupled to a chamber interface 370 of process chamber 310. In some embodiments, collimator assembly 354 can include a collimator housing 410. Collimator housing 410 can include or be coupled to a chamber interface 412 that is configured to facilitate coupling of collimator assembly 354 to chamber interface 370. In some embodiments, chamber interface 412 can be permanently fused with collimator housing 410. In other or similar embodiments, chamber interface 412 can be removably attached to collimator housing 410 via a thread, or held to collimator housing 410 by friction, retention screws, pins, detents, etc. Chamber interface 412 can be configured to fit into a receiving orifice of process chamber 310, such as a receiving orifice of or coupled to chamber interface 370. Chamber interface 412 and the receiving orifice of process chamber 310 can be sealed (i.e., by one or more gas-proof seals or gaskets) to prevent the escape of gases from the environment of process chamber 310.

Figure 5A:
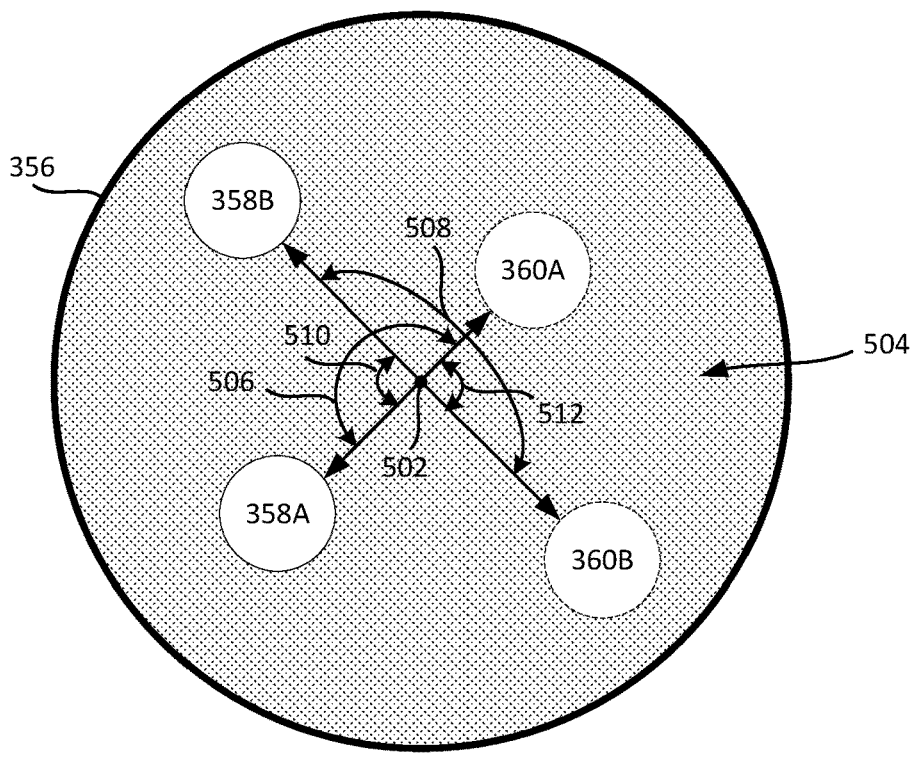
FIG. 5A depicts a cross-sectional view of an example optical bundle, according to aspects of the present disclosure.

As illustrated in FIG. 4A, optical bundle 356 can include at least a first set of optical fibers including first emitting fiber 358A and a first receiving fiber 360A, and a second set of optical fibers including a second emitting fiber 358B and a second receiving fiber 358B. In other or similar embodiments, optical bundle 356 can include any number of sets of optical fibers each including at least one emitting fiber and one receiving fiber. In some embodiments, each optical fiber of optical bundle 356 is arranged around a center point of the optical bundle 356. FIG. 5A depicts a cross-sectional view of an example optical bundle 356, according to aspects of the present disclosure. As illustrated in FIG. 5A, point 502 corresponds to a center point of optical bundle 356. Each fiber of the first set and second sets of optical fibers can be arranged around center point 502. As described above, optical bundle 356 can include an insulating material 504 configured to maintain a position of each optical fiber in accordance with a particular arrangement. Insulating material 504 can further act as a barrier between each optical fiber such to minimize or substantially eliminate cross-talk between adjacent optical fibers. In some embodiments, insulating material 504 can include a plastic material (e.g., a polytetrafluoroethylene (PTFE) material) and/or a ceramic material. In other or similar embodiments, the insulating material 504 can be air.

As illustrated in FIG. 5A, insulating material 504 maintains first emitting fiber 358A in a position that is radially separated from first receiving fiber 360A by a first pairing angle 506. Additionally or alternatively, insulating material 504 maintains second emitting fiber 358B in a position that is radially separated from second receiving fiber 360B by a second pairing angle 508. In some embodiments, first pairing angle 506 and/or second pairing angle 508 are between approximately 175 degrees to approximately 185 degrees. In some embodiments, first pairing angle 506 and/or second pairing angle 508 are approximately 180 degrees. Insulating material 504 can further maintain first emitting fiber 358A in a position that is separated from second emitting fiber 358B by a first separation angle 510. Additionally or alternatively, insulating material 504 can maintain first receiving fiber 360A in a position that is separated from second receiving fiber 360B by a second separation angle 512.

First separation angle 510 and/or second separation angle 512 can be any angle less than approximately 180 degrees, so long as each emitting fiber is at a pairing angle of approximately 180 degrees with a respective receiving fiber. For example, first separation angle 510 and/or second separation angle 512 can be any angle between approximately 0.25 degrees and less than approximately 180 degrees. In some embodiments, first separation angle 510 and second separation angle 512 are equal. For example, first separation angle 510 and second separation angle 512 are between approximately 85 and approximately 95 degrees. In another example, first separation angle 510 and second separation angle 512 are approximately 90 degrees. In other or similar embodiments, first second angle 510 and second separation angle 512 can be unequal. For example, first pairing angle 506 between first emitting fiber 358A and first receiving fiber 360A can be approximately 180 degrees and second pairing angle 508 between second emitting fiber 358B and second receiving fiber 360B can be approximately 175 degrees. Accordingly, first separation angle 510 between first emitting fiber 358A and second emitting fiber 358B can be approximately 90 degrees and second separation angle 512 between first receiving fiber 360A and second receiving fiber 360B can be approximately 85 degrees.

Figure 5B:
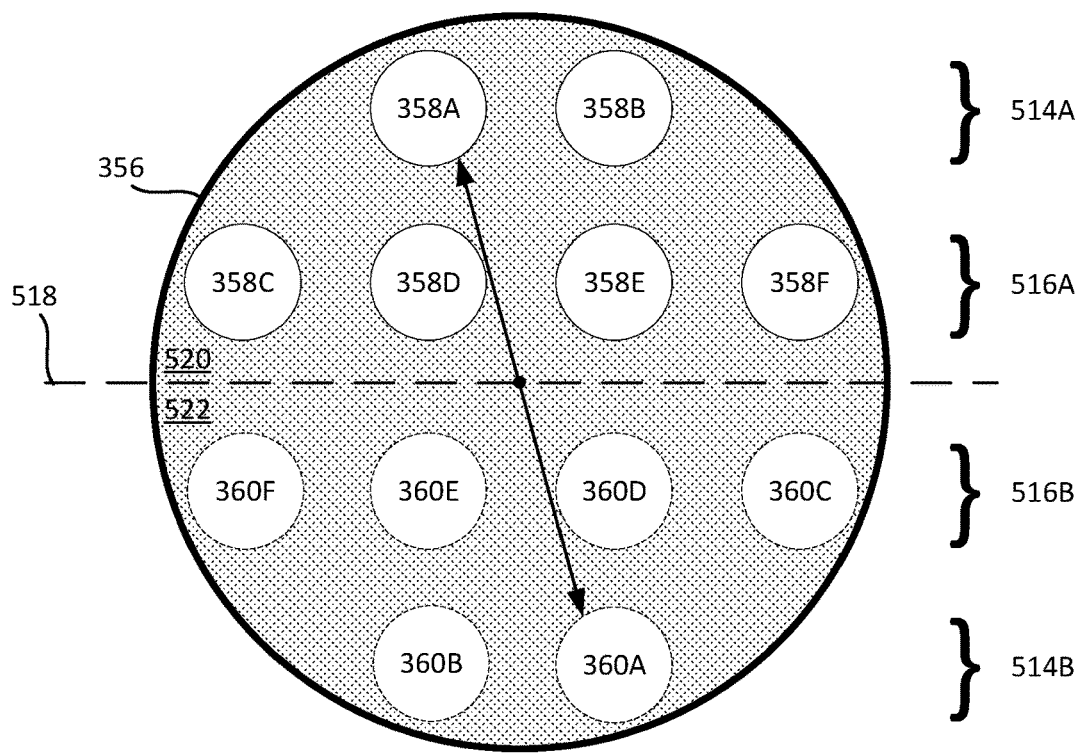
FIG. 5B depicts a cross-sectional view of another example optical bundle, according to aspects of the present disclosure.

FIG. 5B depicts a cross-sectional view of another example optical bundle 356, according to aspects of the present disclosure. In some embodiments, optical fibers of optical bundle 356 can be arranged in paired fiber rows. A centerline 518 can bifurcate the paired fiber rows into an emitting section 520 and a receiving section 522. As illustrated in FIG. 5B, emitting section 520 can include a first emitting row 514A that is paired to a first receiving row 514B of receiving section 522. Additionally or alternatively, emitting section 520 can include a second emitting row 516A that is paired to second receiving row 516B. First emitting row 514A can include one or more emitting optical fibers that are paired to respective receiving optical fibers at a pairing angle of between approximately 175 degrees to approximately 185 degrees. For example, first emitting optical fiber 358A of first emitting row 514A can be paired to first receiving optical fiber 360A of first receiving row 514B at a pairing angle of approximately 180 degrees. Additionally or alternatively, second emitting row 516A can include one or more receiving optical fibers that are paired to respective receiving optical fibers at a pairing angle of between approximately 175 degrees to approximately 185 degrees.

As the pairs of optical fibers (e.g., first emitting optical fiber 358A and first receiving optical fiber 360A are symmetric about center point 502, the ordering of the fiber pairs ensures that each pair of optical fibers is aligned. Additionally, first emitting row 514A is approximately equidistant from centerline 518 as first receiving row 514B. As such, centerline 518 (i.e., an imaginary line) divides optical bundle 356 into substantially equal cross-sectional areas.

Referring back to FIG. 4A, optical bundle 356 is coupled to collimator assembly 354 at conduit 414 of collimator housing 410. Incident light, generated by light generator 362 of FIG. 3, is transmitted from light generator 362 to conduit 414 via first emitting fiber 358A and second emitting fiber 358B. In some embodiments, conduit 414 can be disposed at a top of collimator housing 410 (i.e., at a guiding cap). In other or similar embodiments, conduit 414 can be disposed at another portion of collimator housing 410 (e.g., at a sidewall of collimator housing 410).

Collimator housing 410 can define an enclosure to host various optical elements of collimator assembly 354, such as an achromatic (broadband) lens 416, an optical filler (not shown), and/or an optical interface 418. Interface 418 can include an opening, a waveguide, a lens, and so on. Interface 418 can be configured to allow passage of light but can prevent access of contaminants. For example, upon exiting optical bundle 356, the incident light can pass through a slab or film of an optically transparent material or a diverging or converging lens that mechanically seals conduit 414. Optical filler can include a transparent material configured to facilitate optical path consistency. For example, optical filler can minimize the presence of air, moisture, and/or other possible contaminants along the optical paths of incident light and light reflected from a surface of substrate 202 (referred to as reflected light or output light). In some embodiments, optical filler can be disposed in a space between optical interface 418 and achromatic lens 416.

Achromatic lens 416 can be configured to convert incident light transmitted from each emitting optical fiber 358 of optical bundle 356 to respective achromatic incident light beams. An achromatic light beam can be characterized based on the beam's spectral content for multiple spectral ranges $\Delta\lambda$, such as spectral ranges of width $\Delta\lambda=100$ nm (or 150 nm, 200 nm, or any other range of wavelengths). The spectral ranges can be centered at a sequence of central wavelengths $\Delta\lambda_1$, $\Delta\lambda_2$, $\Delta\lambda_3$, etc. In some embodiments, the ranges are overlapping with $\Delta\lambda$ being greater than the distance between the adjacent central wavelengths. In other or similar embodiments, $\lambda\Delta$ is equal to the distance between the central wavelengths (e.g., $\Delta\lambda=\lambda_3-\lambda_2$). In other or similar embodiments, $\Delta\lambda$ is greater than the distance between the central wavelengths (i.e., the ranges are not overlapping). In some implementations, the ranges has an unequal width. Alternatively, the ranges can correspond to equal frequency intervals. In some implementations, the ranges $\Delta\lambda$ correspond to actual emission ranges of various light emitters of light source 364. In other or similar implementations, the ranges $\Delta\lambda$ are defined for characterization purposes only and may not be restricted to any specific physical light emitters.

Achromatic lens 416 can be a broadband lens designed to minimize chromatic aberration for a wide range of wavelengths. For example, achromatic lens 416 can have multiple lenses made of different materials, with some of the materials having a higher dispersion of the refractive index and some of the materials having a lower dispersion. In some embodiments, achromatic lens 416 is a doublet lens having two optical elements (e.g., a converging lens and a diverging lens). In other or similar embodiments, achromatic lens 416 can be a triplet lens having three or more optical elements. Achromatic lens 416 can be designed for two, three, or more reference wavelengths to have the same focus. For example, some or all of the reference wavelengths can be the central wavelengths, as described above. This can ensure that the chromatic aberration remains small even for wavelengths that fall between the reference wavelengths. The focusing distance(s) of various elements of achromatic lens 416 can be configured such that light beams converted by achromatic lens 416 by the incident light delivered by the emitting fibers 358 of optical bundle 356 are collimated (approximately parallel).

At optical interface 418, incident light is received from emitting fibers 358 and directed towards achromatic lens 416. For example, incident light signals 420A and 420B of FIG. 4A represent incident light received at optical interface 418 from first emitting optical fiber 358A and directed to achromatic lens 416. In another example, incident light signals 422A and 422B represent incident light received at optical interface 418 from second emitting optical fiber 358B. Once incident light is received, achromatic lens 416 can convert the incident light into achromatic light beams. Collimator assembly 354 can direct the achromatic light beams to one or more portions of a surface 426 of substrate 202. In one example, achromatic lens 416 can convert light signal 420A to achromatic light beam 424A and light signal 420B to achromatic light beam 424B. As achromatic lens 416 is configured to convert incident light to collimated, achromatic light beams, light beam 424A and light beam 424B, as directed to substrate surface 426, are approximately parallel. Accordingly, collimator assembly 354 can direct light beam 424A to a first section 428 of substrate surface 426 and light beam 424B to a second portion 430 of substrate surface 426. Additionally or alternatively, achromatic lens 416 can convert incident light signal 422A to achromatic light beam 432A and incident light signal 422B to achromatic light beam 432B. Light beam 432A and light beam 432B can be approximately parallel, as directed to substrate surface 426. Accordingly, collimator assembly can direct light beam 432A to first portion 428 of substrate surface 426 and light beam 432B to second portion 430 of substrate surface 426.

In view of embodiments described above, each of light beam 424A, 424B, 432A, and 432B can include a number of ranges of wavelengths. Each range can be characterized by its central wavelength and its width. Accordingly, each range can include multiple spectral components. In some embodiments, the number of spectral components within each range can be very large or even infinite, as the spectral components can represent a continuum. For purposes of example, each light beam 424A, 424B, 432A, and 432B are described as having two sets of spectral components where the first set of spectral components belongs to a first range of wavelengths and the second set belongs to a second range of wavelengths. However, please note that each light beam can include a higher or lower number of sets of spectral components, in accordance with embodiments provided herein. In some embodiments, the first range of wavelengths is within a 400-700 nm interval of wavelengths and the second range of wavelengths is outside of the 400-700 nm interval of wavelengths. Please note that other the first range of wavelengths and/or the second range of wavelengths can be within or outside of other intervals of wavelengths, in accordance with embodiments provided herein.

Achromatic lens 416 can be configured to direct each of the first set of spectral components to a first portion of a target section of substrate surface 426 and each of the second set of spectral components to a second portion of the target section. For example, achromatic lens 416 can direct the first set of spectral components of light beam 424A to a first portion of first section 428 of substrate surface 426 and the second set of spectral components of light beam 424A to a second portion of first section 428. In some embodiments, the first portion of first section 428 is substantially similar to the second portion of first section 428. For example, an overlap between the second portion and the first portion of first section 428 can be at least 90% of each of the first portion and the second portion. In another example, the overlap between the second portion and the first portion of first section 4289 can be at least 85% of each of the first portion and the second portion. As described above, achromatic lens 416 can direct light beam 432A to first section 428 of substrate surface 426 in addition to light beam 424A. In such embodiments, achromatic lens 416 can direct each of the first set of spectral components of light beam 432A to a third portion of first section 428 and the second set of spectral components of light beam 432A to a fourth portion of first section 428. In some embodiments, the third portion of first section 428 can be the same or can be different from the first portion and/or the second portion of first section 428. Similarly, the fourth portion of first section 428 can be the same or can be different from the first portion and/or the second portion of first section 428. Embodiments described with respect to light beams 424A and 432A can be similarly applied to light beams 424B and 432B.

Each achromatic light beam generated by achromatic lens 416 can be directed to substrate surface 426 at an incident angle 434. As a respective achromatic light beam reaches substrate surface 426 at the incident angle 424, rays of incident light are reflected back towards collimator assembly 354 at a reflected angle 436. The rays of reflected light are referred to as a reflected beam. For example, rays of light beam 424A at first section 428 of substrate surface 426 are reflected back towards collimator assembly 354 as reflected light beam 438A and rays of light beam 424B at second section 430 of substrate surface 426 are reflected back towards collimator assembly 354 as reflected light beam 438B. As light beams 424A and 424B directed toward substrate surface 426 are approximately parallel, reflected light beams 438A and 438B are approximately parallel as well. Additionally or alternatively, rays of light beam 432A at first section 428 of substrate surface 426 are reflected back towards collimator assembly 354 as reflected light beam 440A and rays of light beam 432B at second section 430 of substrate surface 426 are reflected back towards collimator assembly 354 as reflected light beam 440B. As light beams 432A and 432B directed toward substrate surface 426 are approximately parallel, reflected light beams 440A and 440B are approximately parallel as well.

Each of reflected light beam 438A, 438B, 440A, 440B can include a set of reflected spectral components that is produced by a respective set of spectral components of a corresponding incident light beam 424A, 424B, 432A, 432B. For example, reflected light beam 438A can include a first set of reflected spectral components that is produced by the first set of spectral components of light beam 424A, and a second set of reflected spectral components that is produced by the second set of spectral components of light beam 424A.

Light beams reflected from substrate surface 426 are received by achromatic lens 416 and transmitted to optical interface 418. In some embodiments, achromatic lens 416 can transmit a reflected light beam to a receiving optical fiber that is paired to an emitting optical fiber that provided the incident light that subsequently produced the reflected light beam. For instance, first emitting optical fiber 358A transmits incident light to collimator assembly as light signal 420A and light signal 420B. Achromatic lens 416 converts light signal 420A to light beam 424A. Collimator assembly 354 directs light beam 424A to substrate surface 426 at incident angle 434, where light beam 424A is reflected from first section 428 of substrate surface 428 as reflected light beam 438A. Achromatic lens 416 transmits reflected light beam 438A to optical interface 418, where reflected light beam 438A is received by first receiving optical fiber 360A. First receiving optical fiber 360A transmits receiving light beam 438A to light detector 366, in accordance with previously described embodiments. Similarly, first receiving optical fiber 360A can receive reflected light beam 438B from achromatic lens 416. Additionally or alternatively, second receiving optical fiber 360B can receive reflected light beam, 440A and/or reflected light beam 440B from achromatic lens 416, as described above.

In some embodiments, chamber interface 370 can include a transparent window embedded within a portion of process chamber 310 (e.g., lid 332). In some embodiments, a size of an interior of collimator housing 410 (e.g., a diameter, etc.) can correspond to a size of the transparent window. For example, as illustrated in FIG. 4B, a size of the interior of collimator housing 410 can correspond to a size of transparent window 470. Transparent window 470 can include an interior surface 472 and an exterior surface 474. In some embodiments, a collimator housing 410 can be coupled to the exterior of process chamber 310 such that the interior of collimator housing 410 approximately aligns with exterior surface 474 of transparent window 470.

In some embodiments, interior surface 472 and exterior surface 474 of transparent window 470 can be approximately parallel. In other or similar embodiments, interior surface 472 and exterior surface 474 of transparent window 470 are not parallel. For example, exterior surface 474 can be approximately parallel the exterior of process chamber 310, as illustrated in FIG. 4B. However, interior surface 472 can be a tilted surface, meaning that interior surface 472 is not parallel to exterior surface 474 and/or the exterior of process chamber 310.

Figure 6A:
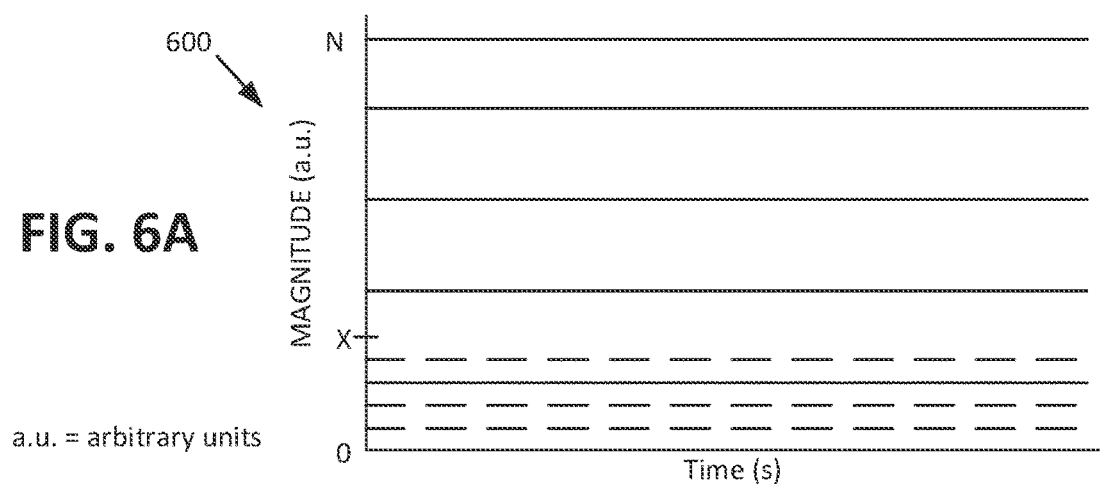
FIGS. 6A-6C illustrate enhanced spectral data collection obtained by an endpoint detection system, according to aspects of the present disclosure.
Figure 6B:
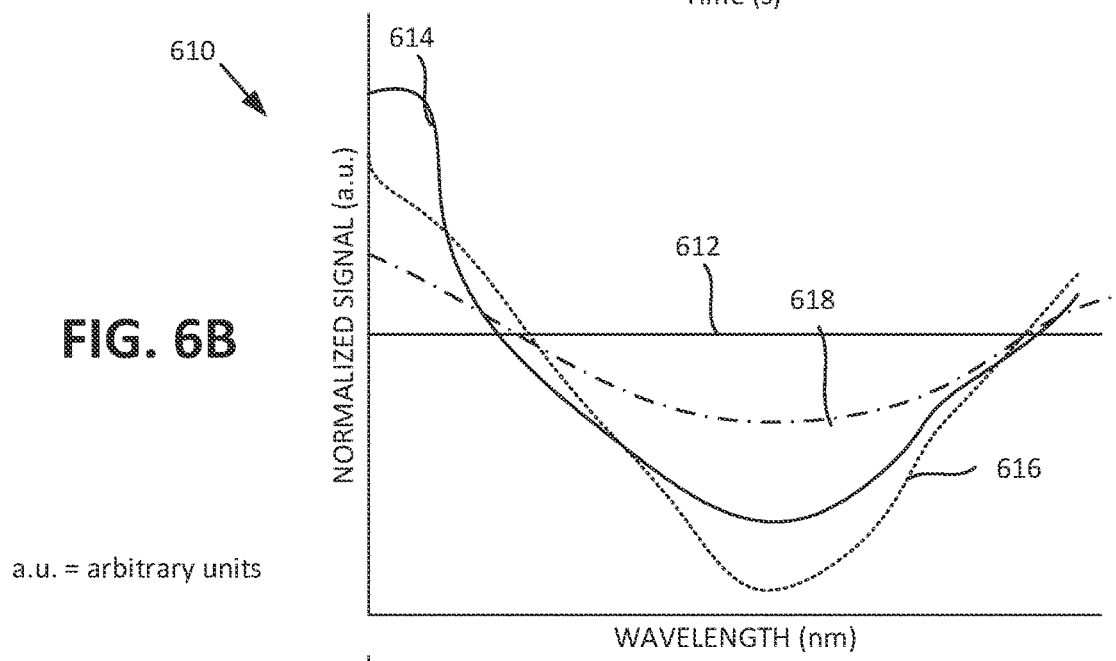
Figure 6C:
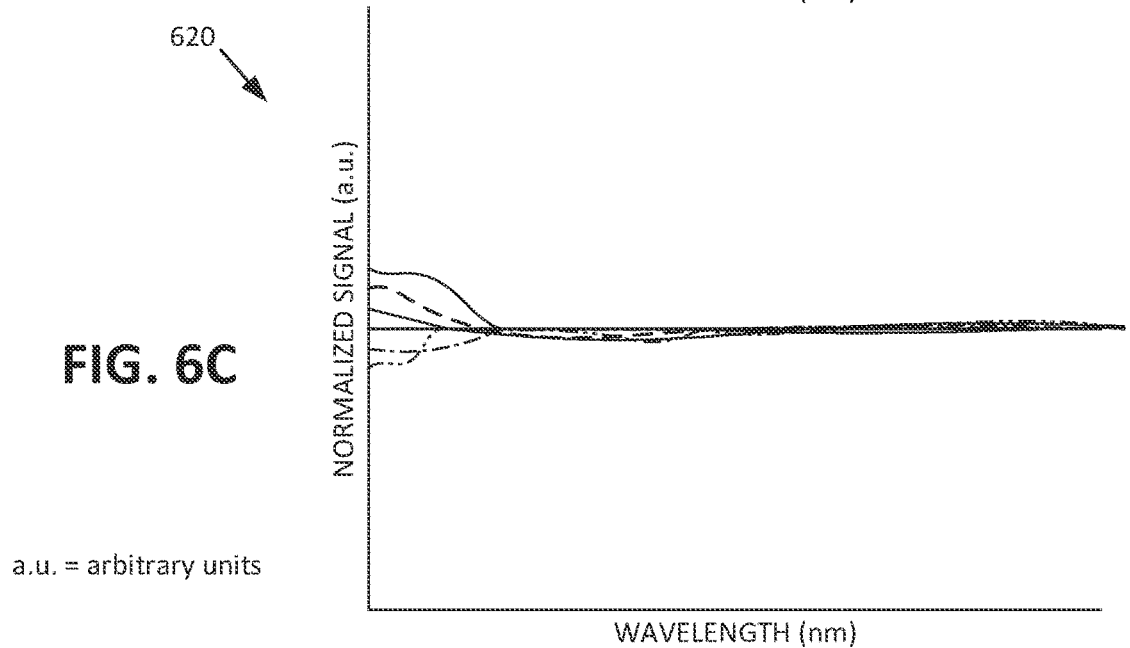

FIGS. 6A-6C illustrate enhanced spectral data collection obtained by an endpoint detection system, according to aspects of the present disclosure. FIG. 6A depicts a graph 600 that illustrates a magnitude of various wavelengths of light detected by conventional endpoint detection equipment compared to endpoint detection equipment of endpoint detection system 300, as described herein. In some embodiments, graph 600 can depict an average magnitude of the various wavelengths of light. The dashed lines of FIG. 6A represent the amplitude of reflected light beams, such as reflected light beams 438A, 438B, 440A, 440B described with respect to FIG. 4A, that are detected by conventional endpoint detection equipment (i.e., endpoint detection equipment that does not include collimator assembly 354 and optical bundle 356, as described herein). In some embodiments, the dashed lines can represent an average amplitude of the reflected light beams. As seen in FIG. 6A, the signal detected by the conventional endpoint detection equipment each fall within a particular magnitude range (i.e., between a magnitude of 0 nm and a magnitude of X nm). The solid lines of FIG. 6A represent the amplitude of the reflected light beams that are detected by endpoint detection system 300, in accordance with embodiments described herein. In some embodiments, the solid lines can represent an average amplitude of the reflected light beams. As seen in FIG. 6A, the signal detected by endpoint detection system 300 are included within and outside of the particular magnitude range that includes wavelengths detected by the conventional endpoint detection equipment. Accordingly, endpoint detection system 300 has a significantly higher throughput and dynamic range (i.e., range of acceptable or possible amplitudes) than conventional endpoint detection equipment, as endpoint detection system 300 can detect signal of the reflected light beams that are not detectable by conventional endpoint equipment. In some embodiments, the throughput of endpoint detection system 300 can be as much as 60% higher than the throughput of conventional endpoint detection equipment.

FIG. 6B depicts a graph 610 including multiple curves that each represent the normalized amplitude of a broadband wavelength of a light signal or light beam (e.g., light beams 424A, 424B, 432A, 432B) directed to a surface of a substrate by conventional endpoint detection equipment. Line 612 represents the relative amplitude when light is normally incident onto the wafer substrate (i.e., the ratio of new spectral intensity to the spectral intensity at normal incident). As illustrated in FIG. 6B, the relative amplitude of the broadband wavelength of the light beam is significantly different when the incident angle increases, e.g., from a first angle to a second angle, represented by lines 614, 616, and 618. The distance between line 612 and lines 614, 616, and 618 illustrates that both beam diameter and spectra shape change significantly when beam has slight misalignment. This difference in can be caused by chromatic dispersion that is present with conventional endpoint detection equipment, as previously discussed. FIG. 6C depicts a graph 620 including multiple curves that each represents the normalized amplitude of broadband wavelength of light beam directed to a surface substrate by endpoint detection system 300. As illustrated in FIG. 6C, the relative amplitude of each wavelength of light beam is approximately the same across the broadband wavelengths of light beam when the incident angle increases from the first angle to the second angle, represented by lines 614, 616, and 618. The distance between line 612 and lines 614, 616, and 618 in FIG. 6C illustrates that both beam diameter and spectra shape stay the same, e.g., when beam has slight misalignment. As described above with respect to FIGS. 4A-4B, the achromatic lens of collimator assembly can significantly reduce and in some instances eliminate chromatic dispersion of light beam, which can cause the diameter of each wavelength of the light beam to be approximately the same. In addition, the configuration of the emitting fibers and the receiving fibers of optical bundle 356 allow for the reduction and/or elimination of chromatic dispersion to be maintained, even if the direction of light beam is misaligned from a target portion of a substrate surface.

FIG. 7 is a flow chart of a method 700 for collecting spectral data by an endpoint detection system, according to aspects of the present disclosure. Method 700 can be performed using systems and/or components described in FIGS. 1-5B, or any combination thereof. In some embodiments, one or more operations of method 700 can be performed by process logic that can include hardware (circuitry, dedicated logic, etc.), software (such as is run on a general purpose computer system or a dedicated machine), firmware, or some combination thereof. In one implementation, method 700 can be performed by a controller for a manufacturing system (e.g., system controller 228). In other or similar implementations, method 700 can be performed by one or more local controllers for endpoint detection system 300, such as a local controller for light component 362 and/or collimator assembly 354. In still other or similar implementations, one or more operations of method 700 can be performed by one or more other machines not depicted in the figures.

At block 710, incident light is transmitted through an optical bundle. In some embodiments, the incident light can be generated by light component 362 and transmitted through optical bundle 356, in accordance with previously described embodiments. For example, the incident light can be transmitted through a first emitting fiber of a first set of optical fibers and a second emitting fiber of a second set of optical fibers. The first set of optical fibers can further include a first receiving fiber that is disposed at a pairing angle relative to the first emitting fiber. The second set of optical fibers can include a second receiving fiber that is disposed at the pairing angle relative to the second emitting fiber. In some embodiments, the pairing angle can be between approximately 175 degrees and approximately 185 degrees. In some embodiments, the pairing angle can be approximately 180 degrees.

At block 712, a first set of spectral components of a first light beam of the incident light is directed to a first portion of a substrate surface and a second set of spectral components of the first light beam are directed to a second portion of the substrate surface. In some embodiments, a first incident light signal is received by collimator assembly 354 of endpoint detection system 300 via the first emitting fiber. Achromatic lens 416 of collimator assembly 354 can convert the first incident light signal to a first light beam that includes multiple spectral components, which each correspond to different wavelengths of light. Achromatic lens 416 can direct a first set of spectral components (i.e., one or more first wavelengths of the first light beam) to the first portion of the substrate surface and a second set of spectral components (i.e., one or more second wavelengths of the second light beam) to a second portion of the substrate surface. The first portion of the substrate surface can be substantially the same (i.e., approximately equal to) as the second portion of the substrate surface.

At block 714, a third set of spectral components of a second light beam of the incident light is directed to a third portion of the substrate surface and a fourth set of spectral components of the second light beam is directed to a fourth portion of the substrate surface. In some embodiments, a second incident light signal is received by collimator assembly 354 via the second emitting fiber of the second set of optical fibers. Achromatic lens 416 can convert the second incident light signal to a second light beam that includes multiple spectral components each corresponding to different wavelengths of light, as described above. Achromatic lens 416 can direct the third set of spectral components to the third portion of the substrate surface and the fourth set of spectral components to a fourth portion of the substrate surface. In some embodiments, the third set of spectral components can be associated with one or more first wavelengths of the second light beam that correspond to the first wavelengths of the first light beam. In other or similar embodiments, the third set of spectral components can be associated with one or more first wavelengths of the second light beam that are different from the first wavelengths of the first light beam. In additional or alternative embodiments, the fourth set of spectral components can be associated with one or more second wavelengths of the second light beam that correspond or do not correspond to the second wavelengths of the first light beam. In some embodiments, the third portion of the substrate surface can be substantially the same as (i.e., approximately equal to) the fourth portion of the substrate surface.

At block 716, a first set of reflected spectral components produced by the first set of spectral components directed to the first portion of the substrate surface is received. A second set of reflected spectral components produced by the second set of spectral components directed to the second portion of the substrate surface is also received. As described with respect to FIGS. 4A-B, collimator assembly can direct an incident light beam including one or more spectral components towards a target portion of the surface of the substrate at an incident angle. The incident light beam is reflected from the target portion of the substrate surface is received by achromatic lens 416 of collimator assembly 354. Accordingly, the first set of spectral components directed to the first portion of the substrate surface (i.e., as a first incident light beam) are reflected from the first portion of the substrate surface as the first set of reflected spectral components. Additionally or alternatively, the second set of spectral components directed to the second portion of the substrate surface (i.e., as a second incident light beam) are reflected from the second portion of the substrate surface as the second set of reflected spectral components. Achromatic lens 416 receives the first and/or second set of reflected spectral components, as previously described. In some embodiments, the first and/or second set of reflected spectral components are transmitted (i.e., as a first reflected light beam and/or a second reflected light beam) to light detector 366 of light component 362 via the first receiving fiber of the first set of optical fibers of fiber bundle 356, in accordance with previously described embodiments.

At block 718, a third set of reflected spectral components produced by the third set of spectral components directed to the third portion of the substrate surface is received. A fourth set of reflected spectral components produced by the fourth set of spectral components directed to the fourth portion of the substrate surface is also received. In accordance with embodiments described with respect to block 716, the third set of spectral components directed to the third portion of the substrate surface (i.e., as a third incident light beam) are reflected from the third portion of the substrate surface as a third set of reflected spectral components. Additionally or alternatively, the fourth set of spectral components directed to the fourth portion of the substrate surface (i.e., as a fourth incident light beam) are reflected from the fourth portion of the substrate surface as the fourth set of reflected spectral components. Achromatic lens 416 receives the third and/or fourth set of reflected spectral components, as previously described. In some embodiments, the third and/or fourth set of reflected spectral components are transmitted (i.e., as a third reflected light beam and/or a fourth reflected light beam) to light detector 366 via the second receiving fiber of the second set of optical fibers of fiber bundle 356, in accordance with previously described embodiments.

At block 720, a reflectance of the substrate surface is determined based on at least one of the first and second sets of reflected spectral components or the third and fourth sets of reflected spectral components. Light detector 368 can receive the first and/or second sets of reflected spectral components via the first receiving fiber and the third and/or fourth sets of reflected spectral components from the second receiving optical fiber, in accordance with previously described embodiments. In some embodiments, light detector 366 and/or a processing device coupled to light component 362 (e.g., a processing device of system controller 228) can determine the reflectance of one or more portions (e.g., the first portion, the second portion, the third portion, or the fourth portion) the substrate surface based on the received sets of reflected spectral components. The reflectance of the one or more portions of the substrate surface can be the basis for or can be included in spectral data generated for the substrate, as previously described.

FIG. 8 is a flow chart for a method 800 of training a machine learning model using spectral data collected by endpoint detection systems at multiple process chambers, according to aspects of the present disclosure. Method 800 can be performed by process logic that can include hardware (circuitry, dedicated logic, etc.), software (such as is run on a general purpose computer system or a dedicated machine), firmware, or some combination thereof. In one implementation, method 800 can be performed by a computer system, such as computer system architecture 100 of FIG. 1. In other or similar implementations, one or more operations of method 800 can be performed by one or more other machines not depicted in the figures.

At block 810, process logic can obtain a first metric indicating a reflectance of a surface of a first substrate during a first substrate process performed at a first process chamber of a manufacturing system. In some embodiments, the reflectance of the surface of the first substrate can be included in spectral data collected for the first substrate by a first endpoint detection system 300 during the first substrate process. At block 812, process logic can generate training data based on the first metric for the first process chamber. In some embodiments, the training data can include a set of training inputs and target outputs. Process logic can generate a first training input based on the first metric for the first process chamber and can include the first training input in the set of training inputs. In some embodiments, process logic can obtain data associated with one or more profile characteristics of the substrate after the substrate process and generate a first target output based on the obtained data. For example, process logic can generate the first target output based on a metrology measurement value generated for the first substrate (i.e., by inline metrology equipment, integrated metrology equipment, external metrology equipment, etc.) after the first substrate process. Process logic can generate a mapping between the first training input and the first target output and add the first target output to the set of target outputs of the training data. In additional or alternative embodiments, process logic can generate the first training input and/or the first target output based on other data associated with the first substrate (e.g., sensor data, etc.).

At block 814, process logic can train a machine learning model to predict an endpoint of a substrate process using the generated training data. In some embodiments, process logic can train the machine learning model to predict the endpoint of the substrate process by training the machine learning model to provide a metrology measurement value for the substrate based on spectral data collected for the substrate during the substrate process. At block 816, process logic can obtain a second metric indicating a reflectance of a surface for a second substrate during a second substrate process performed at a second process chamber of a second manufacturing system. In some embodiments, the reflectance of the surface of the second substrate can be included in spectral data collected for the second substrate by a second endpoint detection system 300 during the second substrate process, in accordance with previously described embodiments.

In some embodiments, the first manufacturing system and the second manufacturing system can be the same manufacturing system, such as manufacturing system 200. Accordingly, the first process chamber and the second process chamber can be distinct process chambers (e.g., process chamber 214 and process chamber 216) of the same manufacturing system. In other or similar embodiments, the first manufacturing system and the second manufacturing system can be the same manufacturing system and the first process chamber can be the same as the second process chamber. In such embodiments, the first endpoint detection system can be the same as the second endpoint detection system. In still other or similar embodiments, the first manufacturing system and the second manufacturing system can be different manufacturing systems. For example, the first manufacturing system can be manufacturing system 200 and the second manufacturing system can be separate and distinct from manufacturing systems 200. In such embodiments, a processing device of the second manufacturing system can be coupled to predictive system 110 of computer architecture 100 (e.g., via a network).

At block 818, process logic can provide data associated with the second metric as input to the trained machine learning model. Process logic can obtain one or more outputs of the trained machine learning model. In some embodiments, the one or more outputs can include an indication of a metrology measurement value and an indication of a level of confidence that the metrology measurement value is associated with the second substrate. In some embodiments, process logic can determine that the metrology measurement value is associated with the second substrate in response to determining that a level of confidence criterion is satisfied (e.g., that the level of confidence exceeds a threshold level of confidence). At block 820, process data can determine, based on the one or more outputs of the trained machine learning model, that an endpoint criterion associated with the second substrate process is satisfied. In some embodiments, process logic can determine that the endpoint criterion is satisfied by determining that the provided metrology measurement value for the second substrate corresponds to a target metrology measurement value for the second substrate. The target metrology measurement value can be associated with the endpoint for the second substrate process. For example, process logic can determine that a difference between the provided metrology measurement value and a target metrology measurement value associated with the endpoint of the substrate process falls below a difference threshold value. If the provided metrology measurement value corresponds to the target metrology measurement value, this can indicate that the endpoint of the second substrate process has been reached and that the second substrate process is to be terminated.

At block 822, process logic can terminate the second substrate process at the second chamber. In some embodiments, process logic can terminate the substrate process at the second chamber in response to determining that the endpoint criterion associated with the second substrate process is satisfied, in accordance with block 820. Process logic can terminate the second substrate process by generating and transmitting an instruction that causes a processing device for the second process chamber (e.g., a system controller, such as system controller 228 or a local controller for the process chamber) to terminate the second substrate process. In some embodiments, in response to determining that the endpoint criterion associated with the second substrate process is not satisfied (e.g., that the provided metrology measurement value does not correspond to the target metrology measurement value), process logic can continue the second substrate process at the second process chamber. For example, process logic can transmit an instruction to the processing device for the second process chamber to continue the second substrate process or can transmit no instructions to the processing device for the second process chamber.

Figure 9:
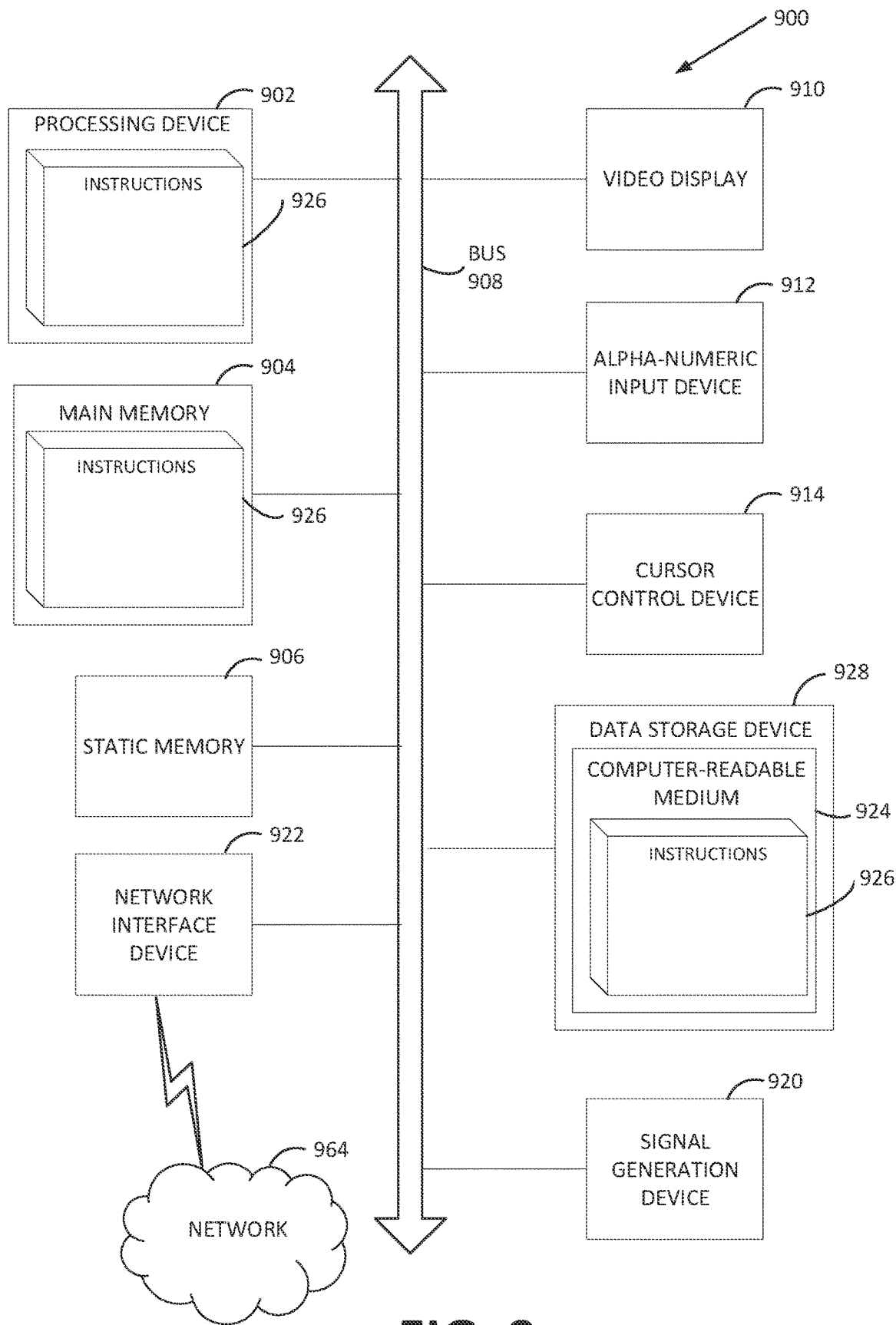
FIG. 9 depicts a block diagram of an illustrative computer system operating in accordance with one or more aspects of the present disclosure.

FIG. 9 depicts a diagrammatic representation of a machine in the example form of a computing device 900 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 900 can correspond to one or more of server machine 170, server machine 180, predictive server 112, or system controller 228, as described herein.

The example computing device 900 includes a processing device 902, a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 928), which communicate with each other via a bus 908.

Processing device 902 can represent one or more general-purpose processors such as a microprocessor, central processing unit, or the like. More particularly, the processing device 902 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. Processing device 902 can also be or include a system on a chip (SoC), programmable logic controller (PLC), or other type of processing device. Processing device 902 is configured to execute the processing logic for performing operations and steps discussed herein.

The computing device 900 can further include a network interface device 922 for communicating with a network 964. The computing device 900 also can include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 920 (e.g., a speaker).

The data storage device 928 can include a machine-readable storage medium (or more specifically a non-transitory computer-readable storage medium) 924 on which is stored one or more sets of instructions 926 embodying any one or more of the methodologies or functions described herein. Wherein a non-transitory storage medium refers to a storage medium other than a carrier wave. The instructions 926 can also reside, completely or at least partially, within the main memory 904 and/or within the processing device 902 during execution thereof by the computer device 900, the main memory 904 and the processing device 902 also constituting computer-readable storage media.

While the computer-readable storage medium 924 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
    a light source component;
    an optical bundle coupled to the light source component, the optical bundle comprising:
        a center point; and
        a set of optical fibers arranged around the center point, the set of optical fibers comprising an emitting optical fiber and a receiving optical fiber, wherein the emitting optical fiber is disposed at a pairing angle relative to the receiving optical fiber around the center point, wherein the pairing angle is between approximately 175 degrees and approximately 185 degrees,
        and wherein the emitting optical fiber receives incident light emitted by the light source component;
    a collimator assembly coupled to the optical bundle, wherein the collimator assembly is to:
        direct at least a first spectral component of a light beam received by the emitting optical fiber to a first portion of a substrate surface and at least a second spectral component of the light beam to a second portion of the substrate surface;
        collect at least a first reflected spectral component and a second reflected spectral component from the substrate surface; and
        transmit the at least the first reflected spectral component and the at least the second reflected spectral component to the receiving optical fiber of the optical bundle;
    a light detection component coupled to the optical bundle, wherein the light detection component is to receive the at least the first reflected spectral component and the at least the second reflected spectral component from the receiving optical fiber; and
    a processor communicatively coupled to the light detection component, the processor to determine a reflectance of the substrate surface based on the at least the first reflected spectral component and the at least the second reflected spectral component.

2. The system of claim 1, wherein the optical bundle further comprises:
    an additional set of optical fibers arranged around the center point, the additional set of optical fibers comprising an additional emitting optical fiber and an additional receiving optical fiber, wherein the additional emitting optical fiber is positioned at the pairing angle relative to the additional receiving optical fiber around the center point.

3. The system of claim 2, wherein the collimator assembly is further to:
    direct at least a third spectral component of an additional light beam to a third portion of the substrate surface and a fourth spectral component of the additional light beam to a fourth portion of the substrate surface;
    collect at least a third reflected spectral component and at least a fourth reflected spectral component from the substrate surface; and
    transmit the at least the third reflected spectral component and the at least the fourth reflected spectral component to the additional receiving optical fiber of the optical bundle, and
    wherein the processor is further to determine the reflectance of the substrate surface based on the at least the third reflected spectral component and the at least the fourth reflected spectral component.

4. The system of claim 1, further comprising:
    a polarizer component coupled between the optical bundle and the collimator assembly, wherein the polarizer is configured to apply at least one of linear polarization or circular polarization to the light beam of the incident light transmitted through the emitting optical fiber.

5. The system of claim 1, wherein the pairing angle is approximately 180 degrees.

6. The system of claim 1, wherein the collimator assembly comprises an achromatic lens.

7. The system of claim 6, wherein the achromatic lens is a doublet lens comprising a converging optical element and a diverging optical element.

8. The system of claim 6, wherein the achromatic lens is a triplet lens.

9. The system of claim 6, wherein the achromatic lens is configured to interface with an exterior surface of a transparent window embedded within an exterior wall of a process chamber including the substrate.

10. The system of claim 9, wherein the transparent window comprises an interior surface that is configured to interface with an environment of the process chamber, and wherein the exterior surface of the transparent window is not parallel to the interior surface of the transparent window.

11. The system of claim 1, wherein an overlap between the second portion and the first portion is at least 90% of each of the first portion and the second portion.

12. The system of claim 1, wherein an overlap between the second portion and the first portion is at least 95% of each of the first portion and the second portion.

13. The system of claim 1, wherein the optical bundle further comprises an insulating material that surrounds the set of optical fibers, wherein the insulating material is configured to maintain the pairing angle between the emitting optical fiber and the receiving optical fiber.

14. The system of claim 1, wherein the collimator assembly is further to modify alignment of an axis of a collimator housing of the collimator assembly relative to a reference point of the surface of the substrate.

15. A manufacturing system comprising:
    a processing chamber;
    a substrate disposed within the processing chamber; and
    an endpoint detection system coupled to the processing chamber, the endpoint detection system comprising:
        a light source component;
        an optical bundle coupled to the light source, the optical bundle comprising:
            a center point; and
            a set of optical fibers arranged around the center point, the set of optical fibers comprising an emitting optical fiber and a receiving optical fiber, wherein the emitting optical fiber is disposed at a pairing angle relative to the receiving optical fiber, and wherein the emitting optical fiber receives incident light emitted by the light source;

a collimator assembly coupled to the optical bundle, wherein the collimator assembly is to:
  direct at least a first spectral component of a light beam received by the emitting optical fiber to a first portion of a substrate surface and at least a second spectral component of the light beam to a second portion of the substrate surface;
  collect at least a first reflected spectral component and a second reflected spectral component from the substrate surface; and
  transmit the at least the first reflected spectral component and the at least the second reflected spectral component to the receiving optical fiber of the optical bundle;

a light detection component coupled to the optical bundle, wherein the light detection component is to receive the at least the first reflected spectral component and the at least the second reflected spectral component from the receiving optical fiber;

a polarizer component coupled between the optical bundle and the collimator assembly, wherein the polarizer is configured to apply at least one of linear polarization or circular polarization to the light beam of the incident light transmitted through the emitting optical fiber; and a processor communicatively coupled to the light detection component, the processor to determine a reflectance of the substrate surface based on the at least the first reflected spectral component and the at least the second reflected spectral component.

16. The manufacturing system of claim 15, further comprising:
a transparent window embedded within an exterior wall of the process chamber, the transparent window comprising an internal surface configured to interface with an environment of the process chamber and an external surface configured to interface with the endpoint detection system, and wherein the collimator assembly of the endpoint detection system is configured to approximately align with the external surface of the transparent window.

17. The manufacturing system of claim 16, wherein the internal surface of the transparent window is not parallel to the external surface of the transparent window.

18. A method comprising:
transmitting incident light through an emitting optical fiber of an optical bundle, wherein the optical bundle further comprises a receiving optical fiber that is disposed at a pairing angle relative to the emitting optical fiber, wherein the pairing angle is between approximately 175 degrees and approximately 185 degrees;

directing, through a collimator assembly, a first spectral component of a light beam of the incident light transmitted through the emitting optical fiber to a first portion of a substrate surface and a second spectral component of the light beam to a second portion of the substrate surface;

receiving, from a light detection component coupled to the optical bundle, at least a first reflected spectral component and at least a second reflected spectral component collected via the collimator assembly; and determining a reflectance of the surface of the substrate based on the at least the first reflected spectral component and the at least the second reflected spectral component.

19. The method of claim 18, further comprising:
directing, through the collimator assembly, a third spectral component of an additional light beam of the incident light transmitted through a second emitting optical fiber of the optical bundle to a third portion of the substrate surface and a fourth spectral component of the additional light beam to a fourth portion of the substrate surface; and receiving, from the light detection component, at least a third reflected spectral component and at least a fourth reflected spectral component collected via the collimator assembly, wherein the reflectance of the substrate surface is further determined based on the at least the third reflected spectral component and the at least the fourth reflected spectral component.

20. The manufacturing system of claim 15, wherein the pairing angle is between approximately 175 degrees and approximately 185 degrees.

* * * * *